(12) United States Patent
Lee et al.

(10) Patent No.: US 11,437,105 B2
(45) Date of Patent: Sep. 6, 2022

(54) MEMORY DEVICE

(71) Applicant: SAMSUNG ELECTRONICS CO., LTD., Suwon-si (KR)

(72) Inventors: Yohan Lee, Incheon (KR); Sangwan Nam, Hwaseong-si (KR); Sangwon Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/234,955

(22) Filed: Apr. 20, 2021

(65) Prior Publication Data

US 2022/0093179 A1 Mar. 24, 2022

(30) Foreign Application Priority Data

Sep. 22, 2020 (KR) .................. 10-2020-0122197

(51) Int. Cl.
| | |
|---|---|
| *G11C 16/10* | (2006.01) |
| *G11C 16/16* | (2006.01) |
| *G11C 16/26* | (2006.01) |
| *G11C 16/04* | (2006.01) |
| *G11C 16/32* | (2006.01) |
| *G11C 16/08* | (2006.01) |
| *G11C 16/30* | (2006.01) |

(52) U.S. Cl.
CPC .......... *G11C 16/16* (2013.01); *G11C 16/0433* (2013.01); *G11C 16/08* (2013.01); *G11C 16/26* (2013.01); *G11C 16/30* (2013.01); *G11C 16/32* (2013.01)

(58) Field of Classification Search
CPC ........................................ G11C 7/14
USPC ........................................ 365/210.1
See application file for complete search history.

(56) References Cited

U.S. PATENT DOCUMENTS

| | | | |
|---|---|---|---|
| 5,311,466 | A | 5/1994 | Natale et al. |
| 6,744,675 | B1 | 6/2004 | Zheng et al. |
| 8,830,755 | B1 | 9/2014 | Dong et al. |
| 9,595,344 | B2 | 3/2017 | Shibata |
| 2015/0146487 | A1 | 5/2015 | Jung |
| 2018/0218775 | A1 | 8/2018 | Kim et al. |
| 2019/0171381 | A1* | 6/2019 | Ioannou ............... G06F 3/0679 |

FOREIGN PATENT DOCUMENTS

KR 10-2018-0090121 A 8/2018

* cited by examiner

*Primary Examiner* — Jason Lappas
(74) *Attorney, Agent, or Firm* — Sughrue Mion, PLLC

(57) ABSTRACT

A memory device includes memory blocks, each including memory cells, and peripheral circuits that control the memory blocks and execute an erase operation for each of the memory blocks. Each memory block includes word lines stacked on a substrate, channel structures extending perpendicular to an upper surface of the substrate and penetrating through the word lines, and a source region disposed on the substrate and connected to the channel structures. During an erase operation in which an erase voltage is input to the source region of a target memory block, the peripheral circuits reduce a voltage of a first word line from a first bias voltage to a second bias voltage at a first time and reduce a voltage of a second word line, different from the first word line, from a third bias voltage to a fourth bias voltage at a second time different from the first in time.

20 Claims, 25 Drawing Sheets

MEMORY DEVICE

CROSS-REFERENCE TO RELATED APPLICATION(S)

This application claims priority under 35 USC 119(a) to Korean Patent Application No. 10-2020-0122197 filed on Sep. 22, 2020 in the Korean Intellectual Property Office, the entire disclosure of which is incorporated by reference herein for all purposes.

BACKGROUND

1. Field

The present disclosure relates to a memory device.

2. Description of the Related Art

Memory devices may provide a function of writing and erasing data or reading recorded data. To accurately read data written to the memory device, it is necessary to appropriately control the distribution of a threshold voltage according to the data written to each of the memory cells. If the distribution of the threshold voltages of the memory cells is not properly controlled after an erase operation of erasing the recorded data, the distribution of the memory cells after the programming operation may also be deteriorated, and the performance of the memory device may be degraded.

SUMMARY

It is an aspect to provide a memory device to reduce a voltage input to word lines connected to memory cells from a first bias voltage to a second bias voltage during an erase operation, thereby significantly reducing the influence of a coupling component between word lines and a channel layer in the erase operation, and to reduce the variation of a threshold voltage distribution of memory cells, thereby improving the performance of the memory device.

According to an aspect of one or more example embodiments, there is provided a memory device comprising a cell area in which a plurality of memory blocks, each including a plurality of memory cells, are disposed; and a peripheral circuit area including peripheral circuits that control the plurality of memory blocks and that are configured to execute an erase operation for each of the plurality of memory blocks as a unit, wherein each of the plurality of memory blocks includes a plurality of word lines that are stacked on a substrate, a plurality of channel structures that extend in a first direction perpendicular to an upper surface of the substrate and that penetrate through the plurality of word lines, and a source region that is disposed on the substrate and connected to the plurality of channel structures, and during the erase operation in which an erase voltage is provided to the source region of a target memory block among the plurality of memory blocks, the peripheral circuits are configured to reduce a voltage of a first word line from a first bias voltage to a second bias voltage at a first time, and to reduce a voltage of a second word line, different from the first word line, from a third bias voltage to a fourth bias voltage at a second time different from the first time.

According to another aspect of one or more example embodiments, there is provided a memory device comprising a plurality of word lines stacked on a substrate; a plurality of channel structures that extend in a first direction perpendicular to an upper surface of the substrate and that penetrate through the plurality of word lines; a source region disposed on the substrate and connected to the plurality of channel structures; a plurality of separation layers that divide the plurality of word lines into a plurality of memory blocks; and a peripheral circuit configured to input an erase voltage to the source region in an erase operation executed for each of the plurality of memory blocks as a unit, wherein the plurality of word lines include a first word line group and a second word line group each including two or more word lines, the second word line group being disposed between the first word line group and the substrate in the first direction, and the peripheral circuit is configured to input a same voltage to the first word line group and the second word line group while a voltage of the source region increases to the erase voltage, and is configured to reduce a voltage input to the first word line group earlier than a voltage input to the second word line group is reduced, while the voltage of the source region is maintained at the erase voltage.

According to yet another aspect of one or more example embodiments, there is provided a memory device comprising a cell area in which a plurality of memory blocks are disposed, each of the plurality of memory blocks including a plurality of word lines that are stacked on a substrate, a plurality of channel layers that extend in a first direction perpendicular to an upper surface of the substrate and that penetrate through the plurality of word lines, and a source region that is disposed on the substrate and connected to the plurality of channel layers; and a peripheral circuit area including peripheral circuits that control the cell area and that are configured to execute an erase operation for each of the plurality of memory blocks as a unit, wherein an erase time at which an erase voltage is input to the source region includes a transition period in which a voltage of the source region increases to the erase voltage and a hold period in which the voltage of the source region is maintained at the erase voltage, and the peripheral circuit area is configured to set a voltage difference between the plurality of word lines and the plurality of channel layers to a first level during a first time in the hold period, to set a voltage difference between a portion of the plurality of word lines and the plurality of channel layers to a second level higher than the first level during a second time after the first time, and to set the voltage difference between the plurality of word lines and the plurality of channel layers to the second level during a third time after the second time.

According to yet another aspect of one or more example embodiments, there is provided a memory device comprising a substrate on which a plurality of memory cells divided into a plurality of memory blocks are provided, each memory block including a common source line, a plurality of word lines, and a plurality of bit lines stacked on the substrate in a first direction perpendicular to an upper surface of the substrate, wherein, during an erase operation of a memory block of the plurality of memory blocks, an erase voltage is input to the common source line and/or the plurality of bit lines and a bias voltage of a first word line is reduced at a first time and a bias voltage of a second word line disposed closer to the substrate than the first word line is reduced at a second time different from the first time.

BRIEF DESCRIPTION OF DRAWINGS

The above and other aspects will be more clearly understood from the following detailed description, taken in conjunction with the accompanying drawings, in which.

DETAILED DESCRIPTION

Hereinafter, various example embodiments will be described with reference to the accompanying drawings.

Figure 1:
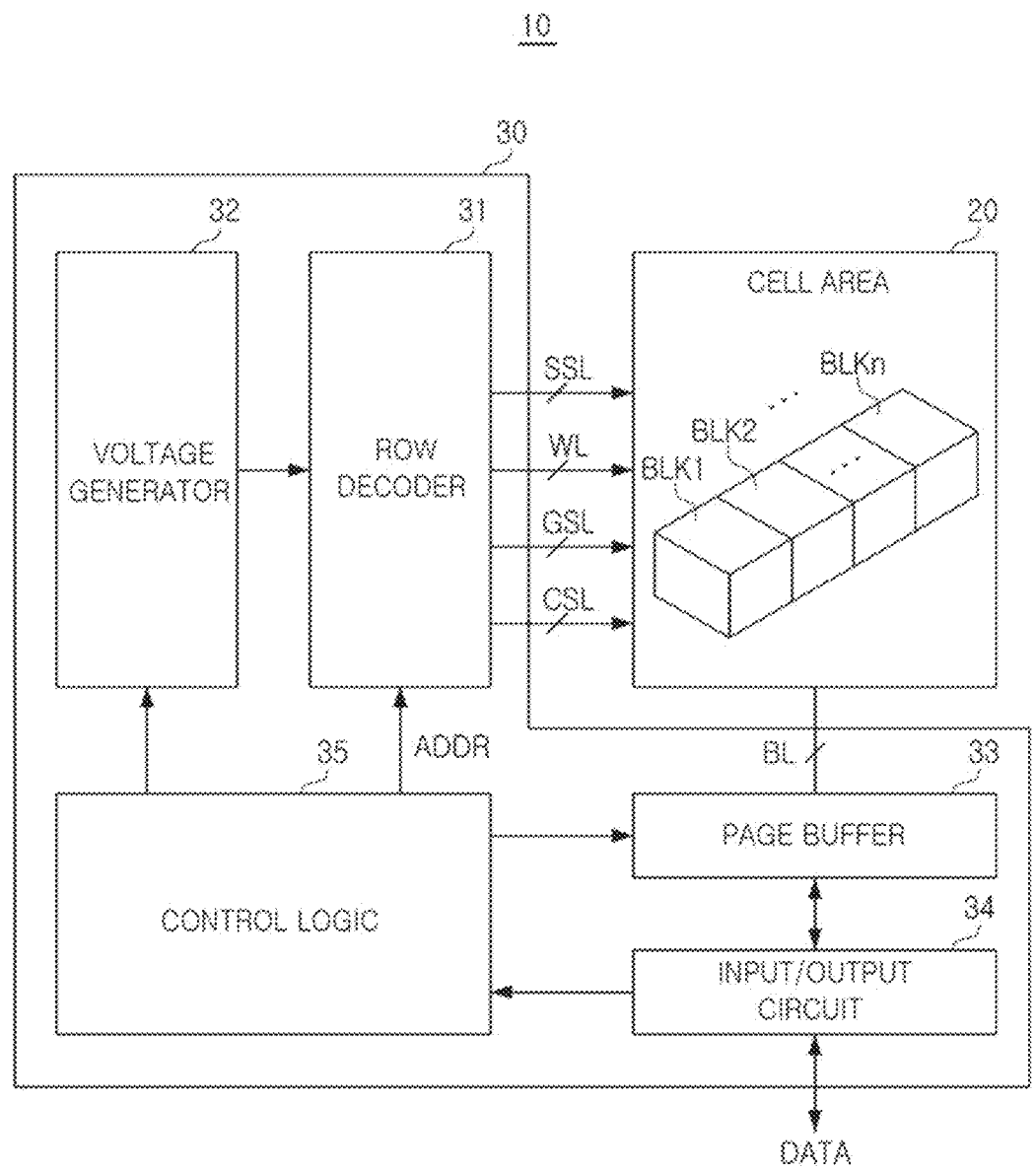
FIG. 1 is a schematic diagram of a memory device according to an example embodiment.

FIG. 1 is a schematic diagram of a memory device according to an example embodiment.

Referring to FIG. 1, a memory device 10 may include a cell area 20 and a peripheral circuit area 30. The peripheral circuit area 30 may include a row decoder 31, a voltage generator 32, a page buffer 33, an input/output circuit 34, a control logic 35, and the like.

The cell area 20 includes a plurality of memory cells that may be divided into a plurality of blocks BLK1 to BLKn. The plurality of blocks BLK1 to BLKn may be connected to the row decoder 31 through common source lines CSL, string selection lines SSL, word lines WL and ground selection lines GSL, and may be connected to the page buffer 33 through bit lines BL. For example, in each of the blocks BLK1 to BLKn, a plurality of memory cells arranged at a same height from a substrate are connected to the same word line WL, and a plurality of memory cells disposed in a same position on a plane parallel to an upper surface of the substrate may provide a memory cell string sharing one channel layer. Also, some of the memory cell strings included in each of the blocks BLK1 to BLKn may be connected to a same bit line BL.

The row decoder 31 may generate and transmit voltages for driving the word lines WL by decoding address data ADDR received from the control logic 35 or the like. The row decoder 31 may provide a word line voltage generated by the voltage generator 32 to the word lines WL in response to the control of the control logic 35. For example, the row decoder 31 may be connected to the word lines WL through pass transistors, and may input a word line voltage to the word lines WL when the pass transistors are turned on.

The page buffer 33 is connected to the cell area 20 through the bit lines BL, and may read data stored in memory cells or write data to the memory cells. The page buffer 33 may include a column decoder, a latch circuit and the like. The column decoder may select at least a portion of the bit lines BL of the cell area 20, and the latch circuit may read data from a memory cell connected to the bit line BL selected by the column decoder during a reading operation.

The input/output circuit 34 may receive data DATA during a programming operation and may transfer the received data to the page buffer 33, and during a reading operation, the page buffer 33 may output the data that has been read from the cell area 30 by the page buffer 33 externally. The input/output circuit 34 may transmit an address or command received from an external memory controller to the control logic 35.

The control logic 35 may control operations of the row decoder 31, the voltage generator 32, the page buffer 33, and the input/output circuit 34. In an example embodiment, the control logic 35 may operate according to a control command transmitted from an external memory controller or the like.

The voltage generator 32 may generate control voltages for the operation of the memory device 10, for example, a program voltage, a read voltage, an erase voltage, a pass voltage, and the like, using a power supply voltage input from an external source. The voltage generated by the voltage generator 32 may be supplied to the peripheral circuit area 30 or may be input to the cell area 20 through the row decoder 31 or the like.

The peripheral circuit area 30 may execute a programming operation, a reading operation, an erase operation, or the like for the plurality of blocks BLK1 to BLKn, and the erase operation may be performed in a unit of a memory block. For example, the erase operation may be performed in a unit of each of the plurality of memory blocks BLK1 to BLKn. For example, the peripheral circuit area 30 may execute the erase operation by applying an erase voltage to a common source line CSL and/or bit lines BL connected to a target memory block for the erase operation, from among the plurality of memory blocks BLK1 to BLKn.

In the erase operation, a bias voltage may be input to the word lines WL connected to memory cells of the target memory block. The bias voltage may be predetermined. In an example embodiment, bias voltages input to the word lines WL may be controlled in consideration of characteristics of each of the memory cells included in the target memory block. For example, different bias voltages may be input to at least some of the word lines WL included in the target memory block according to a height of the word lines WL from a substrate.

On the other hand, in an example embodiment, the voltage of the word lines WL may decrease from a first bias voltage to a second bias voltage during the erase operation. Accordingly, while the erase voltage is input to the common source line CSL and/or the bit line BL, a decrease in the efficiency of the erase operation caused by coupling of the word lines WL and the channel layer may be significantly reduced. In addition, by inputting different bias voltages to at least some of the word lines WL according to the height of the word lines WL from the substrate, a difference in threshold voltage distribution in memory cells after the erase operation may be reduced. By reducing the difference in the threshold voltage distribution of the memory cells in the erased state, a margin between the threshold voltage distributions of each of the memory cells may be sufficiently secured according to the data written to each of the memory cells, thereby improving the performance of the memory device 10.

Figure 2:
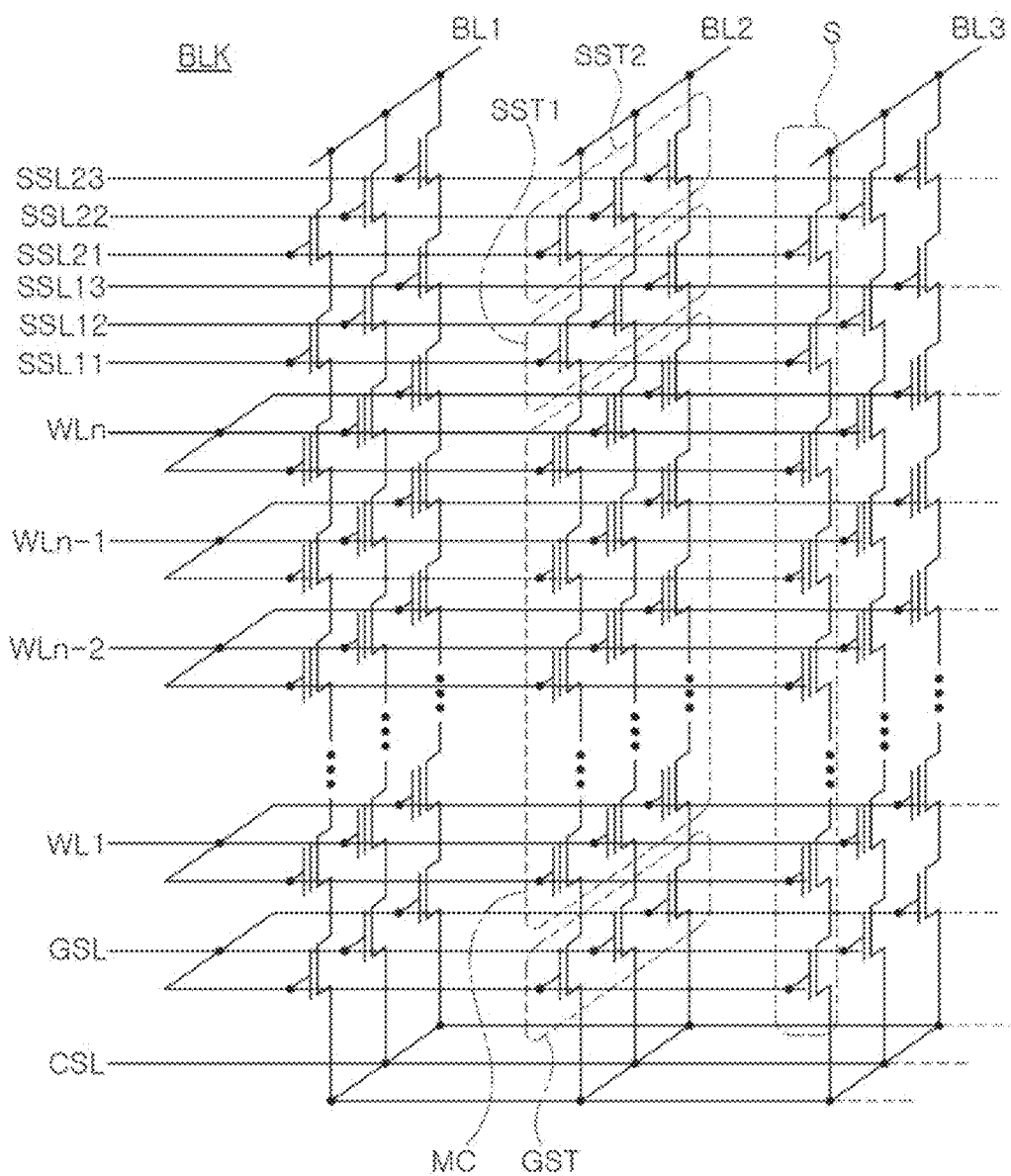
FIGS. 2 and 3 are schematic diagrams illustrating a memory device according to an example embodiment.
Figure 3:
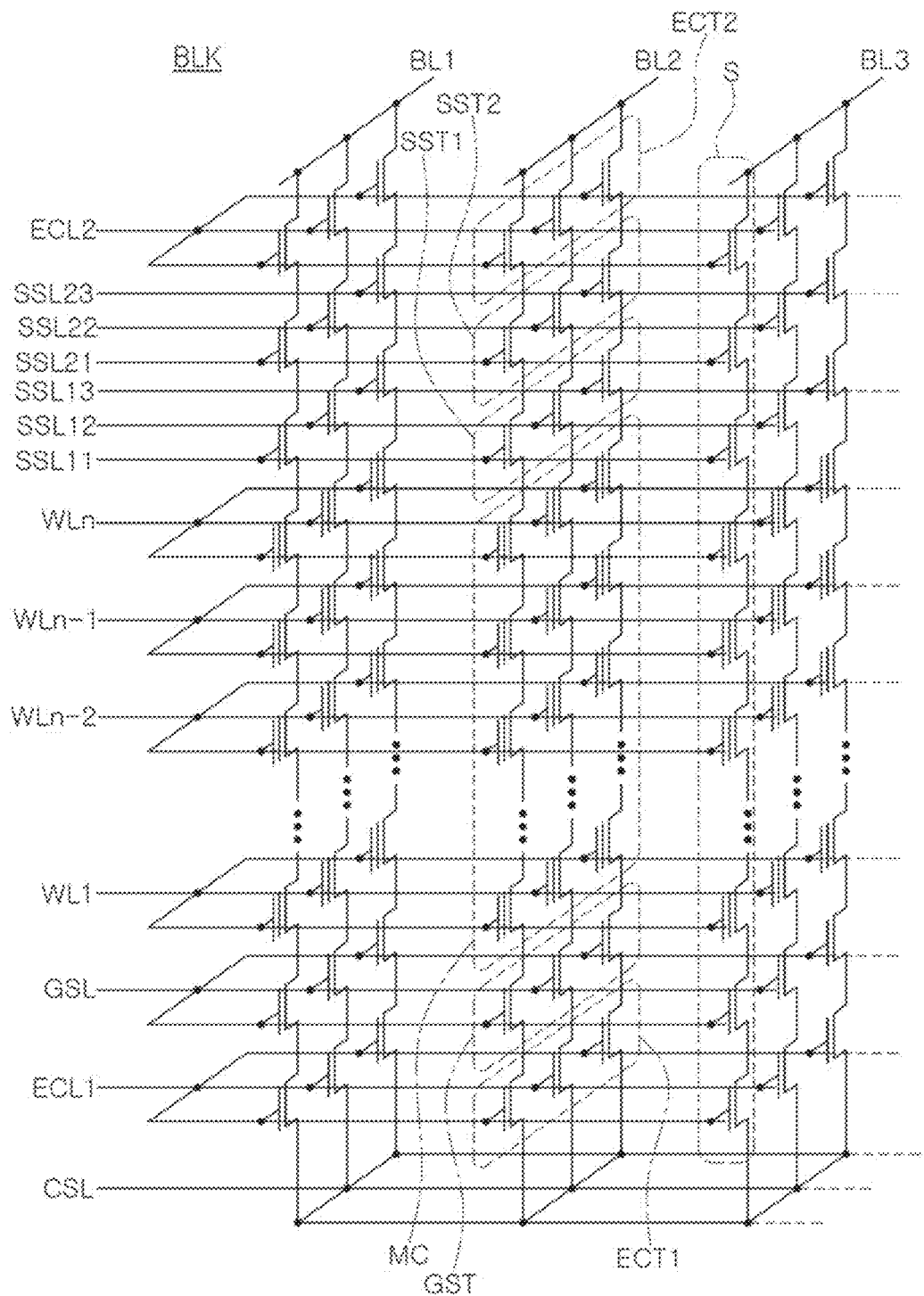

FIGS. 2 and 3 are schematic diagrams illustrating a memory device according to an example embodiment.

Referring to FIGS. 2 and 3, one memory block BLK may include a plurality of memory cell strings S, and at least some of the memory cell strings S may share word lines WL1 to WLn and/or bit lines BL1 to BL3.

In the example embodiment illustrated in FIG. 2, each of the memory cell strings S may include a plurality of memory cells MC connected between string selection transistors SST1 to SST2 and a ground selection transistor GST. In each of the memory cell strings S, the first string selection transistors SST1 and the second string selection transistors SST2 are connected to each other in series, and the second string selection transistors SST2 disposed in an upper portion may be connected to one of the bit lines BL1 to BL3. The ground selection transistor GST may be connected to the common source line CSL. The common source line CSL may be electrically connected to an impurity region formed on the substrate. The memory cells MC included in each of the memory cell strings S may share one channel layer.

In the example embodiment illustrated in FIG. 3, each of the memory cell strings S may further include a first erase control transistor ECT1 and a second erase control transistor ECT2. The first erase control transistor ECT1 may be connected between the ground selection transistor GST and the common source line CSL, and the second erase control transistor ECT2 may be connected between the second string selection transistors SST2 and the bit lines BL1-BL3. In the erase operation, the first erase control transistor ECT1 and the second erase control transistor ECT2 may generate a gate induced drain leakage current by a voltage input to the first erase control line ECL1 and the second erase control line ECL2.

The plurality of memory cells MC may be connected between the first string selection transistors SST1 and the ground selection transistor GST in series. Depending on example embodiments, the number of string selection transistors SST1 to SST2 and the ground selection transistors GST may be variously modified, and each of the memory cell strings S may further include at least one dummy memory cell. For example, the dummy memory cells may be connected between the first string selection transistors SST1 and the memory cells MC, and/or between the ground selection transistor GST and the memory cells MC.

Gate electrodes of the plurality of memory cells MC may be connected to the word lines WL1 to WLn. In addition, the gate electrode of the ground selection transistor GST may be connected to the ground selection line GSL, and the gate electrodes of the string selection transistors SST1 to SST2 may be connected to the string selection lines SSL11 to SSL23. Gate electrodes of the first erase control transistor ECT1 and the second erase control transistor ECT2 may be connected to the first erase control line ECL1 and the second erase control line ECL2, respectively.

The ground selection line GSL, the word lines WL1-WLn, and the string selection lines SSL11-SSL23 may be stacked in a first direction perpendicular to the upper surface of the substrate. The ground selection line GSL, the word lines WL1-WLn, and the string selection lines SSL11-SSL23 may be penetrated by a channel structure including a channel layer. The channel layer may be connected to one of the bit lines BL1 to BL3. Also, the channel layer may be connected to the common source line CSL. The common source line CSL is formed in the semiconductor substrate on which the memory block BLK is formed, and may be doped with a predetermined impurity and provided as a source region.

In the example embodiment illustrated in FIG. 3, the channel structure may penetrate through the first and second erase control transistors ECT1 and ECT2. For example, the channel layers of the first and second erasing control transistors ECT1 and ECT2 may include impurities of a conductivity type different from that of channel layers of the channel layer of the ground selection transistor GST, the memory cells MC, and the string selection transistors SST1-SST2. In an example embodiment, the channel layers of the first and second erase control transistors ECT1 and ECT2 may include N-type impurities.

In the erase operation, an erase voltage having a high level may be input to the impurity region of the substrate, and the erase voltage may be input to the channel layers through the common source line CSL. According to example embodiments, an erase voltage may also be input to the bit lines BL1 to BL3. While the erase voltage is input to the impurity region, a bias voltage may be input to the word lines WL. The bias voltage may be predetermined. The voltage of the channel layer shared by the memory cells MC increases by the erase voltage, and charges trapped in the charge storage layer of the memory cells MC may be removed by the difference between the bias voltage input to the word lines WL and the voltage of the channel layer, and the erase operation may be performed.

The memory cells MC may have different characteristics according to the height thereof from the substrate. For example, the channel layer may have a larger volume as a distance from the common source line CSL increases. Accordingly, when the same erase operation is applied to the memory cells MC, the upper memory cells MC may have a greater threshold voltage distribution than the lower memory cells MC.

In an example embodiment, by controlling the voltage input to the word lines WL in the erase operation according to the height of the word lines WL from the substrate, the difference in threshold voltage distribution of the memory cells MC after the erase operation may be reduced. For example, a time at which a low level bias voltage is input to the upper word lines WL may be set to be longer than a time at which a low level bias voltage is input to the lower word lines WL. Accordingly, a strong erase operation may be performed relatively longer in the upper memory cells MC, and a difference in threshold voltage distribution of the memory cells MC may be reduced.

In addition, in an example embodiment, voltages of the word lines WL may be reduced from a high level to a low level in the erase operation. Unlike in the example embodiment, if the voltage of the word lines WL increases, the voltage of the channel layer may increase to a level higher than a level of the erase voltage input to the common source line CSL and/or the bit lines BL1-BL3 due to the coupling between the word lines WL and the channel layer. As a result, the hole injection efficiency into the channel layer may be degraded, the erase operation may be delayed, and the threshold voltage distribution of the memory cells MC may be deteriorated. By contrast, in an example embodiment, the voltage of the channel layer may be prevented from increasing to a level higher than the level of the erase voltage by reducing the voltage of the word lines WL, and the erase operation may quickly proceed, and deterioration of the threshold voltage distribution of the memory cells MC may be prevented.

Figure 4:
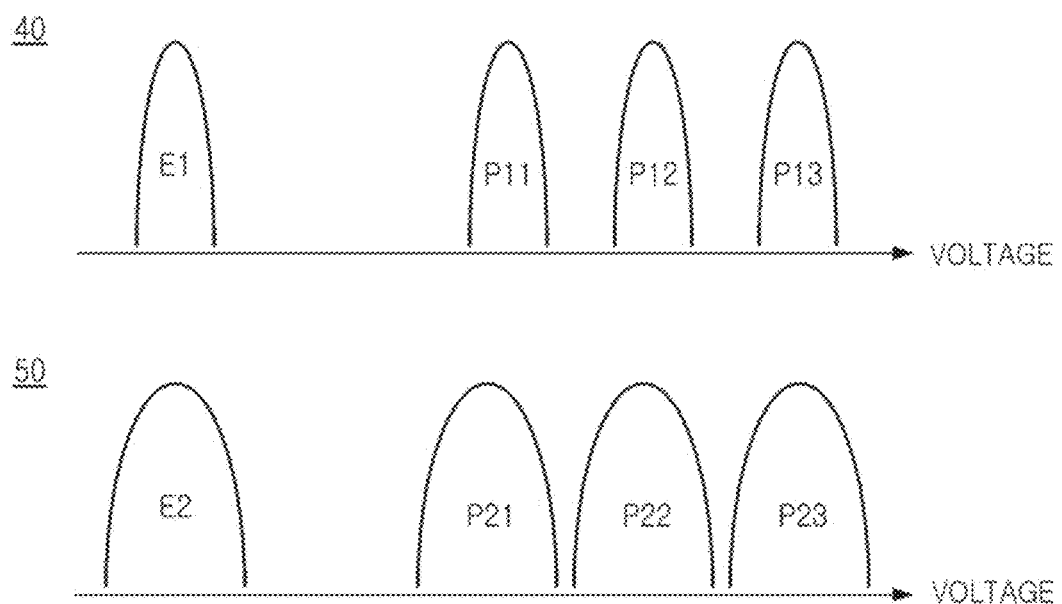
FIG. 4 is a diagram illustrating an operation of a memory device according to an example embodiment.

FIG. 4 is a diagram provided to illustrate an operation of a memory device according to an example embodiment.

As described above, the erase operation of the memory device may be executed in the unit of a memory block, and memory cells included in one memory block may have different characteristics depending on locations thereof. For example, a memory cell disposed in a relatively high position (e.g., a higher height from the substrate) may have different characteristics from a memory cell disposed in a relatively low position (e.g., a lower height from the substrate).

In the example embodiment illustrated in FIG. 4, a first voltage distribution 40 may be a graph illustrating the threshold voltage distribution of the first memory cell disposed in a relatively high position from the substrate, and a second voltage distribution 50 may be a graph illustrating the threshold voltage of the second memory cell disposed in a relatively low position from the substrate. In the erase state, a threshold voltage distribution E1 of the first memory cell may be lower than a threshold voltage distribution E2 of the second memory cell. Accordingly, in the respective program states, threshold voltage distributions P11 to P13 of the first memory cell may also be different from threshold voltage distributions P21 to P23 of the second memory cell. On the other hand, although the example embodiment illustrated in FIG. 4 provides the case in which each of the memory cells stores 2 bits of data, the configuration is not necessarily limited thereto.

Referring to FIG. 4, a difference between the threshold voltage distributions E1 and E2 in an erase state may affect a program state. Therefore, for example, in a case in which the same read voltage is applied to the first memory cell and the second memory cell in a reading operation, an error may occur.

In an example embodiment, to reduce the difference between the threshold voltage distributions E1 and E2 of the memory cells in the erase state, the voltage input to the word line connected to the first memory cell and the voltage input to the word line connected to the second memory cell may be controlled differently. Accordingly, a difference between the threshold voltage distributions E1 and E2 of the memory cells in the erase state may be reduced, and the performance of the memory device may be improved.

Figure 5:
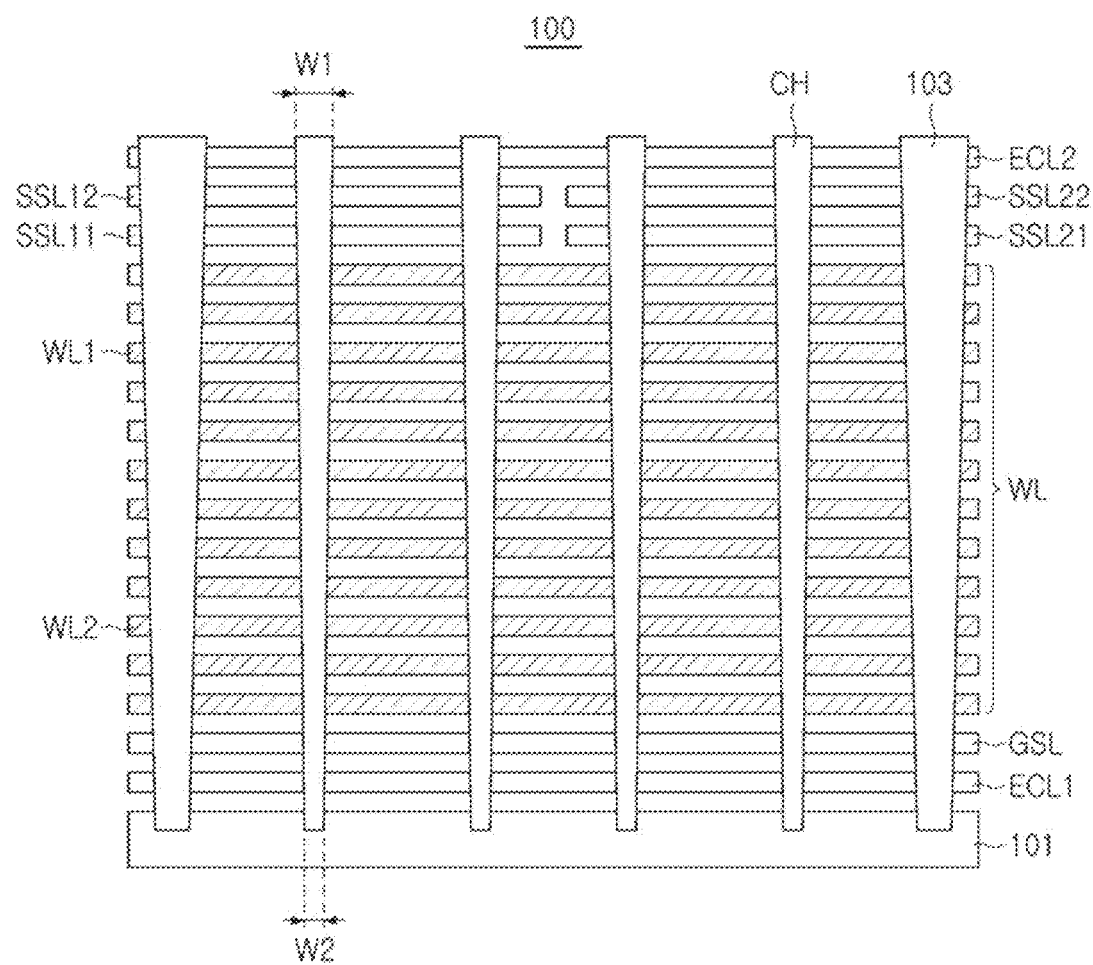
FIG. 5 is a schematic diagram of a memory device according to an example embodiment.

FIG. 5 is a schematic diagram of a memory device according to an example embodiment.

FIG. 5 may be a simplified diagram illustrating a cell area of a memory device 100 according to an example embodiment. The memory device 100 may correspond to the memory device 10 described above. Referring to FIG. 5, a cell area may include a substrate 101, a first erase control line ECL1 stacked on the substrate 101, a ground selection line GSL, word lines WL, string selection lines SSL11, SSL12, SSL21 and SSL22, and a second erase control line ECL2. Channel structures CH may extend from the second erase control line ECL2 to the substrate 101, and structures stacked on the substrate 101 may be divided into a plurality of regions by separation layers 103.

For example, a plurality of memory blocks included in the cell area may be defined by the separation layers 103. For example, one memory block may be defined between a pair of separation layers 103 adjacent to each other. In other words, one memory block between separation layers 103 is illustrated in FIG. 5 by way of example.

Each of the channel structures CH includes a channel layer, and the channel layer may have a pillar shape extending in a direction perpendicular to the upper surface of the substrate 101. A gate insulating layer (not shown) is disposed on an outer side of the channel layer, and the gate insulating layer may include at least one of a tunneling layer, a charge storage layer, and a blocking layer. The channel layer may include an undoped semiconductor material or a semiconductor material doped with impurities. In an example embodiment, the channel layer is formed of a semiconductor material doped with an N-type impurity at the same heights as the erase control lines ECL1 and ECL2, and the channel layer may be formed of a semiconductor material that is not doped or is doped with P-type impurities at the same heights as the ground selection lines GSL, word lines WL, and string selection lines SSL11, SSL12, SSL21 and SSL22.

Referring to FIG. 5, the width of each of the channel structures CH may decrease as a distance from the upper surface of the substrate 101 decreases. For example, each of the channel structures CH may have a first width W1 at an uppermost end, and a second width W2 at a lowermost end, where the second width W2 is less than the first width W1. Accordingly, the characteristics of the memory cells connected to each of the word lines WL may vary depending on the height from the upper surface of the substrate 101.

For example, memory cells connected to a first word line WL1 disposed at a first height from the upper surface of the substrate 101 may be provided by the channel structures CH having a relatively great width. On the other hand, memory cells connected to a second word line WL2 disposed at a second height, lower than the first height, may be provided by channel structures CH having an intermediate width.

As described above, each of the channel structures CH may include a charge storage layer disposed between the channel layer and the word lines WL, and data may be written to the memory cells by charges trapped in the charge storage layer during a programming operation. Therefore, in the erase operation for the memory block, a relatively short erase time is applied to the memory cells connected to the second word line WL2 adjacent to the charge storage layer of a relatively small volume, and a relatively long erase time is applied to the memory cells connected to the first word line WL1 adjacent to the charge storage layer of a relatively large volume.

In an example embodiment, to apply different erase times to memory cells connected to the first word line WL1 and the second word line WL2, respectively, the bias voltages input to the first word line WL1 and the second word line WL2, respectively, may be controlled differently, during the erase time at which the erase voltage is input to the channel layer through bit lines and/or the substrate 101 connected to the channel structures CH. This will be described with reference to FIG. 6 below.

FIGS. 6 to 9 are diagrams provided to illustrate an operation of a memory device according to example embodiments. For example, FIGS. 6-9 may illustrate the operation of the memory device 100 illustrated in FIG. 5.

An erase operation on at least one target memory block among memory blocks included in a memory device will be described with reference to FIG. 6. To perform the erase operation according to the example embodiment described with reference to FIG. 6, the peripheral circuit area of the memory device may input various voltages to the cell area.

Figure 6:
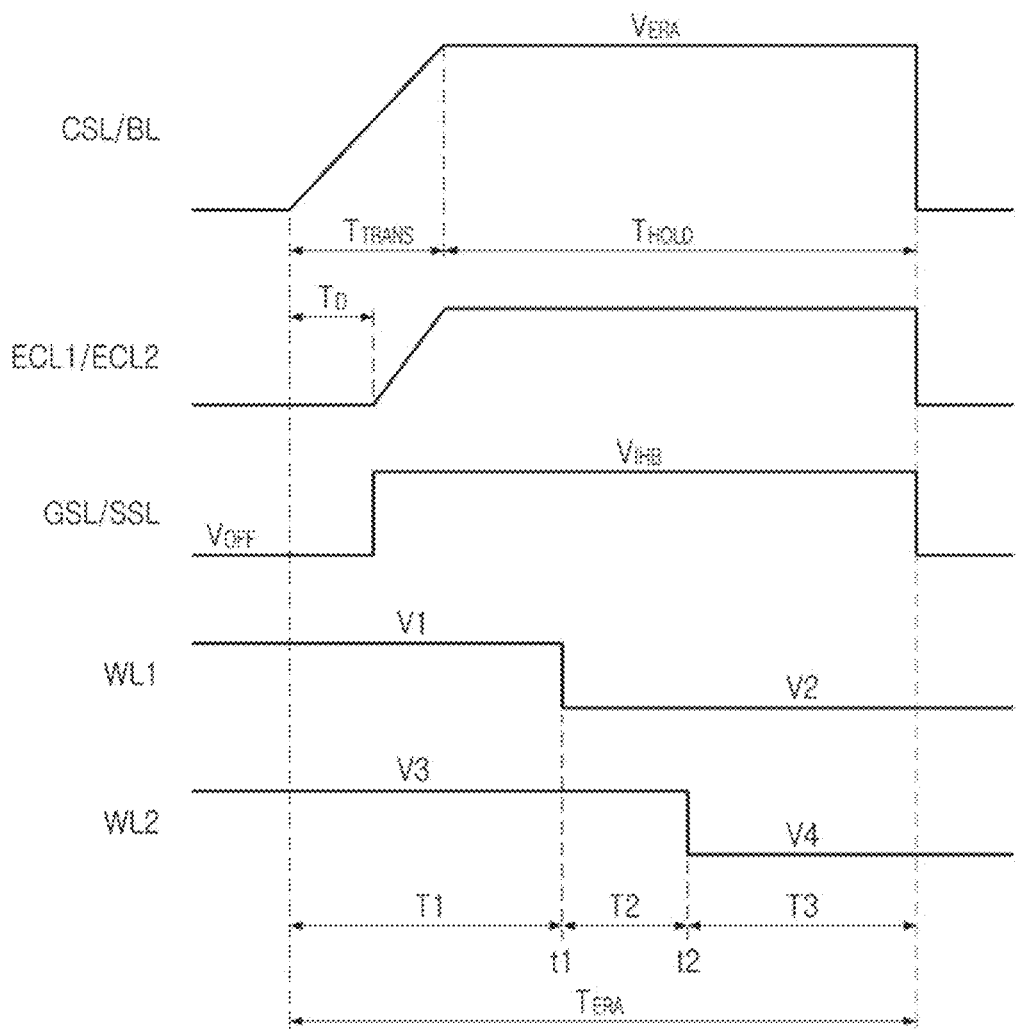
FIGS. 6 to 9 are diagrams illustrating an operation of a memory device according to example embodiments.

Referring to FIG. 6, an erase voltage $V_{ERA}$ may be input to the common source line CSL and/or the bit lines BL. According to example embodiments, the erase voltage $V_{ERA}$ may be input to both the common source line CSL and the bit lines BL, or the erase voltage $V_{ERA}$ may be input only to the common source line CSL or only to the bit lines BL. For example, the erase voltage $V_{ERA}$ may be input to an impurity region formed on a substrate, and may be input to the channel layers through the common source line CSL. Alternatively or additionally, the erase voltage $V_{ERA}$ may be input to the channel layers through the bit lines BL. The voltage of the channel layers may increase by the erase voltage $V_{ERA}$. The description below will focus on an example in which the erase voltage $V_{ERA}$ is input to both the common source line CSL and the bit lines BLs for conciseness.

In an example embodiment, an erase time $T_{ERA}$ may include a transition period $T_{TRANS}$ in which the voltage of the common source line CSL and the bit lines BL increase to the erase voltage $V_{ERA}$, and a hold period $T_{HOLD}$ in which the voltage of the common source line CSL and the bit lines BL is maintained as the erase voltage $V_{ERA}$. The voltage of the erase control lines ECL1 and ECL2 may be maintained at a level, which may be a predetermined level, for example, a ground level during a delay time $T_D$, and may float after the delay time $T_D$ elapses.

The ground selection line GSL and the string selection line SSL may receive a turn-off voltage $V_{OFF}$ during the delay time $T_D$ and may receive a suppression voltage $V_{IHB}$ after the delay time $T_D$. Accordingly, the ground selection transistor and the string selection transistor may be turned off during the delay time $T_D$ and may be turned on after the delay time $T_D$. Depending on example embodiments, the times at which the turn-off voltage $V_{OFF}$ is input to the ground selection line GSL and the string selection line SSL, respectively, may be different, and in some example embodiments, a first suppression voltage may be applied to the ground selection line GSL, and a second suppression voltage of a level different from that of the first suppression voltage may be input to the string selection line SSL.

On the other hand, in the peripheral circuit area, voltages of the word lines WL may be reduced in the hold period $T_{HOLD}$. For example, the voltage of the first word line WL1 may decrease from a first bias voltage V1 to a second bias voltage V2 at a first time point, i.e., time t1 from the beginning of the transition period $T_{TRANS}$. The voltage of the second word line WL2 may decrease from a third bias voltage V3 to a fourth bias voltage V4 at a second time point, i.e., time t2 from the beginning of the transition period $T_{TRANS}$, where the second time point, i.e., time t2 is different from the first time point, i.e., time t1. Depending on example embodiments, the first bias voltage V1 and the third bias voltage V3 may have the same level of voltage or may be different levels. Similarly, the level of the second bias voltage V2 and the level of the fourth bias voltage V4 may be the same or may be different from each other.

In the example embodiment illustrated in FIG. 6, the first time point, i.e., time t1, is earlier than the second time point, i.e., time t2, and the first word line WL1 may be disposed at a higher position from the substrate than the second word line WL2. As previously described with reference to FIG. 5, the memory cell connected to the first word line WL1 may include a charge storage layer and a channel layer having a larger volume than the memory cell connected to the second word line WL2. Accordingly, in the erase operation, it is advantageous to apply a longer erase time to the memory cell connected to the first word line WL1 than the memory cell connected to the second word line WL2. In an example embodiment, the voltage of the first word line WL1 is decreased earlier than the voltage of the second word line WL2, such that a longer erase time may be applied to the memory cell connected to the first word line WL1.

Referring to FIG. 6, the erase time $T_{ERA}$ may include a first time period T1, a second time period T2, and a third time period T3. In the memory cell connected to the first word line WL1, a strong erase operation may be performed during the second time period T2 and the third time period T3, and in the memory cell connected to the second word line WL2, a strong erase operation may be applied only during the third time period T3. Accordingly, after the erase operation, a difference in threshold voltage distribution that may occur depending on the locations of memory cells may be significantly reduced, and performance of the memory device may be improved.

For example, when the first bias voltage V1 and the third bias voltage V3 have the same level, and the second bias voltage V2 and the fourth bias voltage V4 have the same level, a voltage difference between the word lines WL and the channel layer may be the first level during the first time period T1. For example, the first level may be defined as a difference between the erase voltage $V_{ERA}$ and the first bias voltage V1.

On the other hand, during the second time period T2, a voltage difference between a portion of the word lines WL, for example, the first word line WL1 and the channel layer may be set to a second level higher than the first level. The second level may be a difference between the erase voltage $V_{ERA}$ and the second bias voltage V2. During the third time period T3, a voltage difference between the word lines WL and the channel layer may be set to be the second level.

Figure 7:
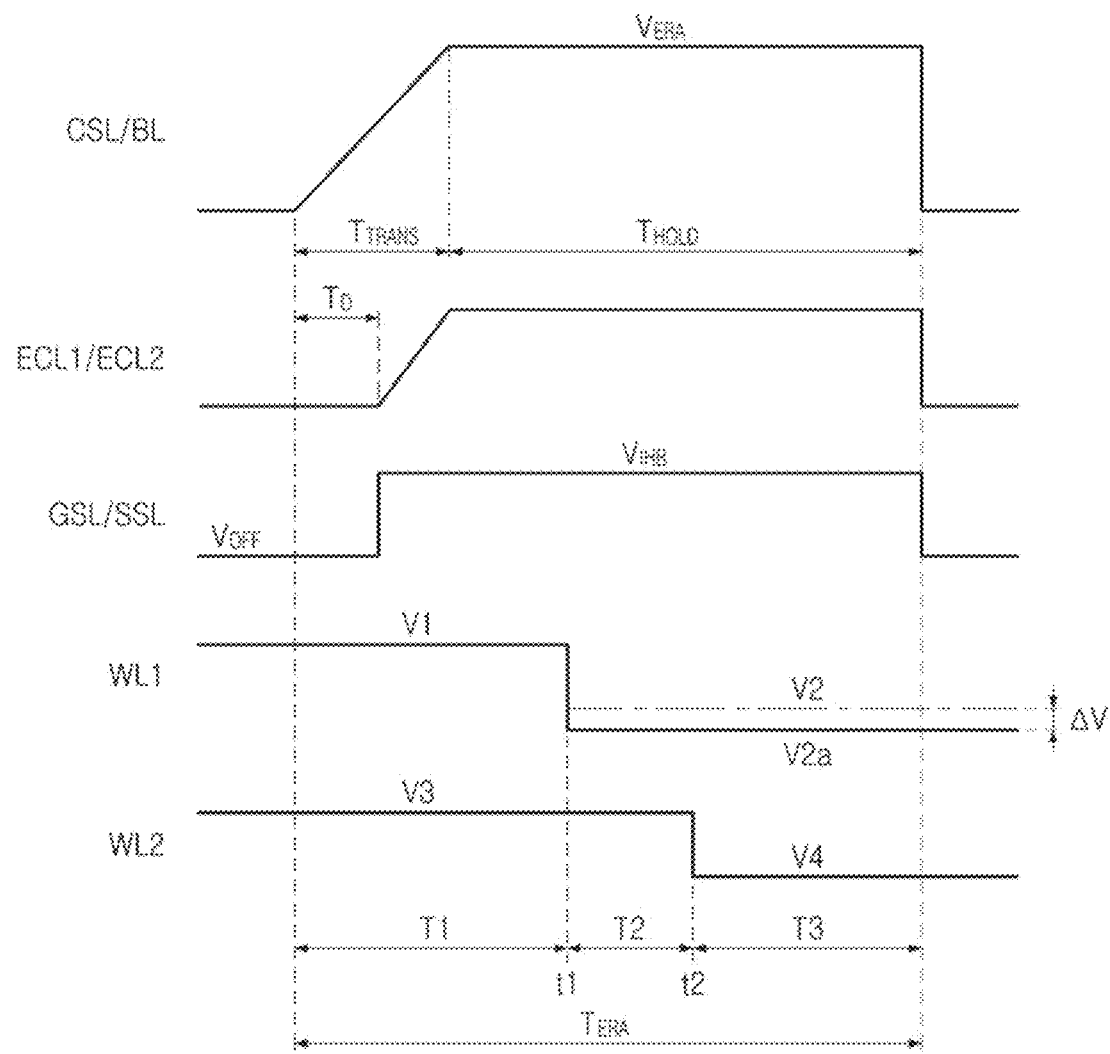

In an example embodiment illustrated in FIG. 7, to further increase the effect of the erase operation on the memory cells connected to the first word line WL1, the magnitude of the second bias voltage V2 may be changed by a voltage difference (ΔV). The voltage difference may be predetermined. Referring to FIG. 7, the second bias voltage V2 may be set to be a lower level V2a than that in the example embodiment described with reference to FIG. 6. Accordingly, the voltage difference between the first word line WL1 and the channel layer during the second time period T2 and the third time period T3 may increase, compared to the example embodiment illustrated in FIG. 7, and the threshold voltage distribution of the memory cells connected to the first word line WL1 may be further reduced.

In an example embodiment, the difference in threshold voltage distribution of the memory cells after the erase operation may be significantly reduced using the magnitude of the bias voltages V1, V2, V2a, V3 and V4 input to the word lines WL1 and WL2 at the first time point, i.e., time t1, and at the second time point, i.e., time t2, and/or the first and second time points, times t1 and t2. For example, when it is expected that the difference in the threshold voltage distribution between the memory cells connected to the first word line WL1 and the memory cells connected to the second word line WL2 is not great, the second time period T2 between the first time point, i.e., time t1, and the second time point, i.e., time t2, may be set to be short. Conversely, when the difference in the threshold voltage distribution between the memory cells connected to the first word line WL1 and the memory cells connected to the second word line WL2 is expected to be relatively great, the second time period T2 between the first point in time t1 and the second point in time t2 may be set to be relatively long.

In addition, in an example embodiment, by decreasing the voltage input to the word lines WL without increasing the voltage during the erase time $T_{ERA}$, the voltage of the channel layer may be prevented from becoming higher than the erase voltage $V_{ERA}$ input to the bit lines BL and/or the common source line CSL. Accordingly, a problem in which the voltage of the channel layer increases to be greater than the erase voltage $V_{ERA}$, and thus, the hole does not flow into the channel layer and the efficiency of the erase operation decreases may be prevented. Hereinafter, this situation will be described with reference to FIGS. 8 and 9 together.

Figure 8:
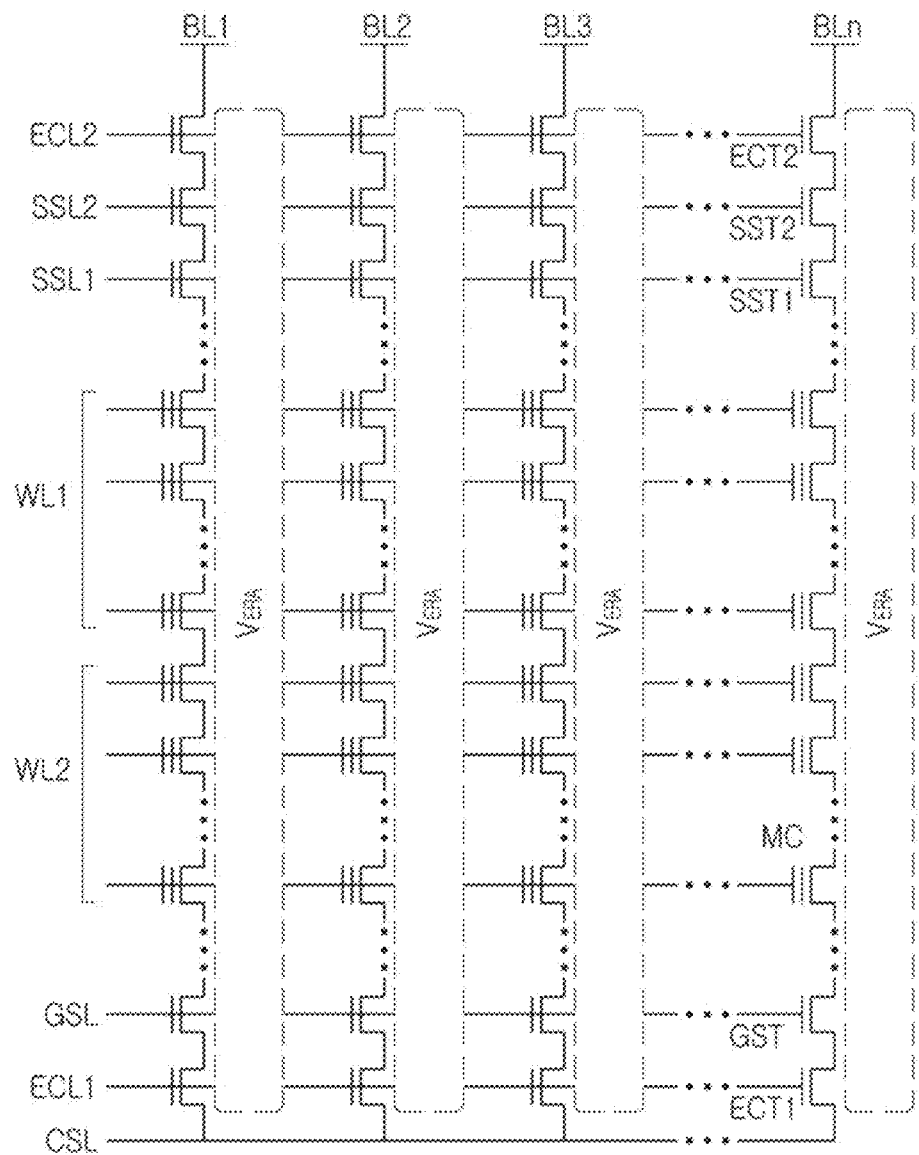
Figure 9:
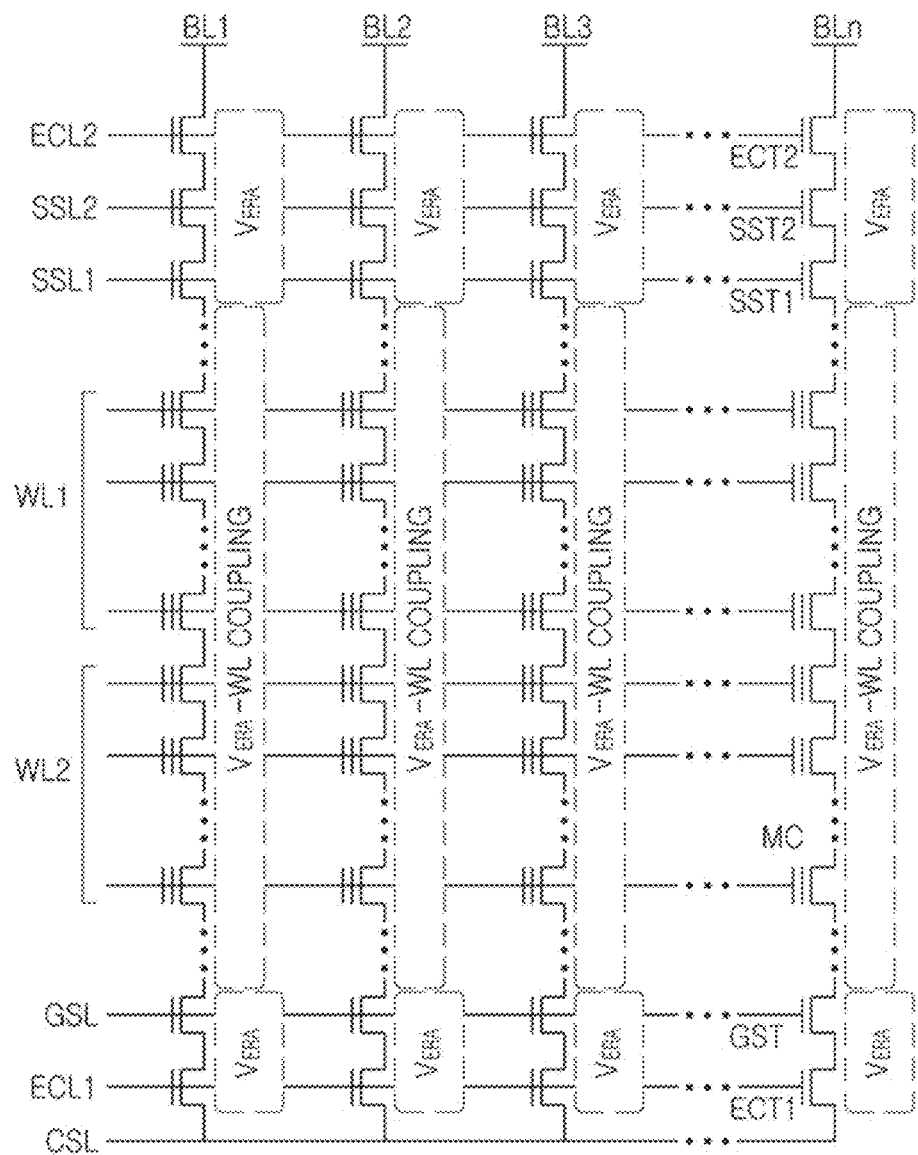

Referring to FIGS. 8 and 9, a memory block of a memory device may include a plurality of memory cell strings, and the memory cell strings may be connected to the bit lines BL1-BLn and the common source line CSL. Each of the memory cell strings may include first and second erase control transistors ECT1 and ECT2, a ground selection transistor GST, memory cells MC, and string selection transistors SST1 and SST2. The memory cells MC may be connected to word lines, and the word lines may include first word lines WL1 disposed in a relatively high position with respect to the substrate and second word lines WL2 disposed in a relatively low position with respect to the substrate.

Referring to FIGS. 6 and 8 together, as the erase voltage $V_{ERA}$ is input to the bit lines BL and/or the common source line CSL to perform the erase operation, the voltage of the channel layer in each of the memory cell strings may increase up to the erase voltage $V_{ERA}$. As the voltage of the first word lines WL1 decreases from the first bias voltage V1 to the second bias voltage V2 at a first time point, i.e., time t1, the voltage of the channel layer may decrease from the erase voltage $V_{ERA}$ as illustrated in FIG. 9. In this case, the degree to which the voltage of the channel layer is decreased may be determined by a coupling effect that occurs when the voltage of the first word lines WL1 decreases to the second bias voltage V2.

Referring to FIG. 9, a voltage of the channel layer after the first time point, i.e., time t1, may be less than a voltage of the common source line CSL and/or the bit lines BL1-BLn. Accordingly, holes may be smoothly introduced into the channel layer during the second time period T2 and the third time period T3 after the first time point, i.e., time t1, and charges trapped in the charge storage layer of the memory cells MC may be effectively removed, and the performance of the erase operation may be improved.

Figure 10:
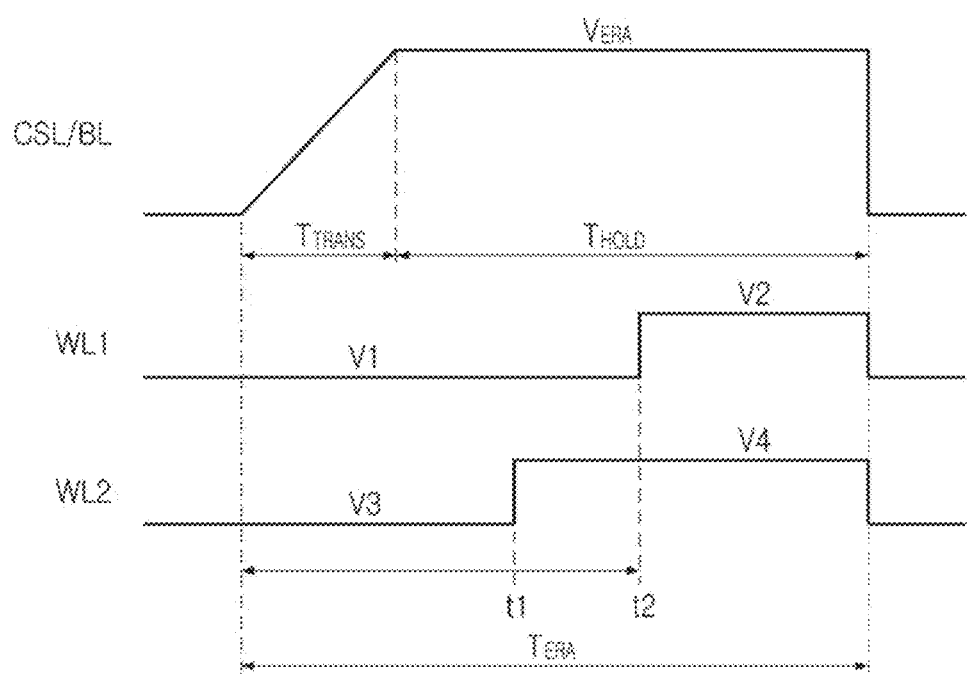
FIGS. 10 to 12 are diagrams illustrating comparative examples for describing the operation of a memory device according to example embodiments.
Figure 11:
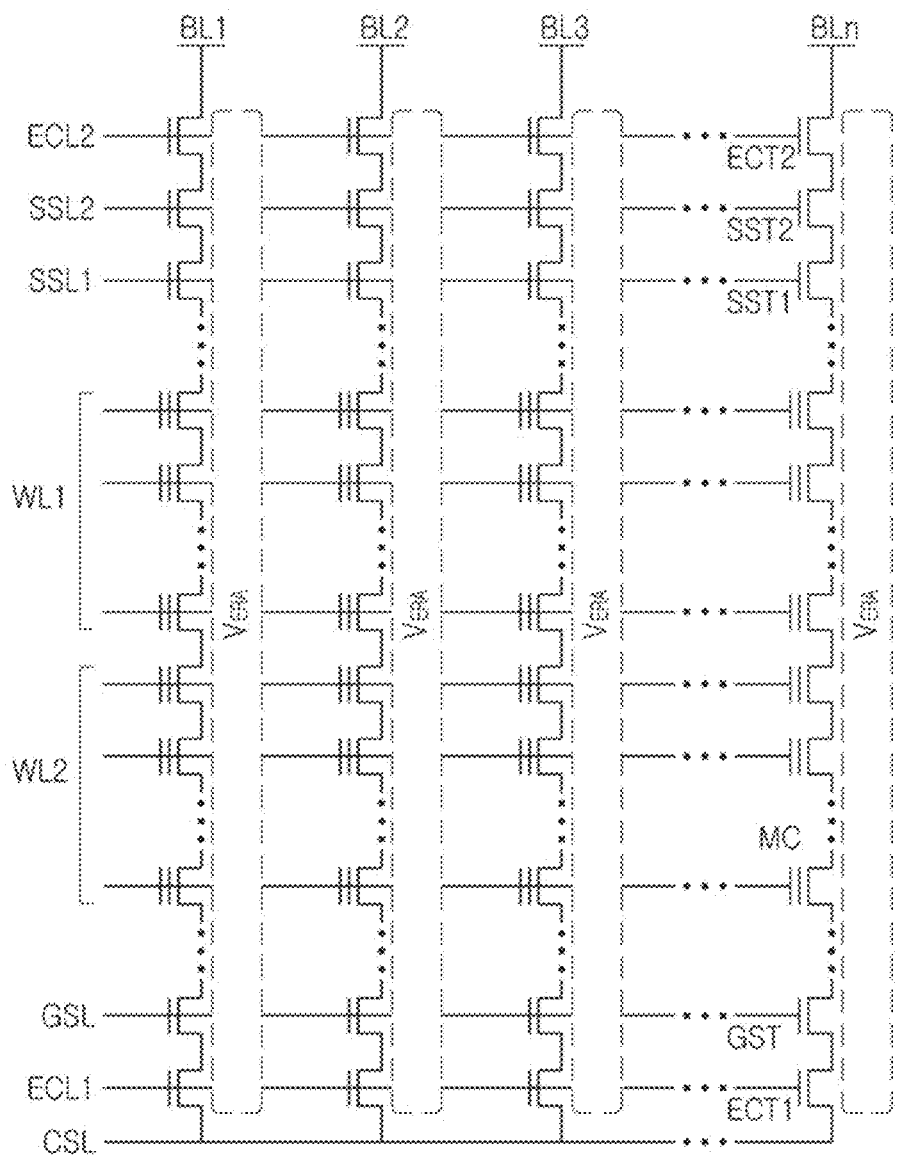
Figure 12:
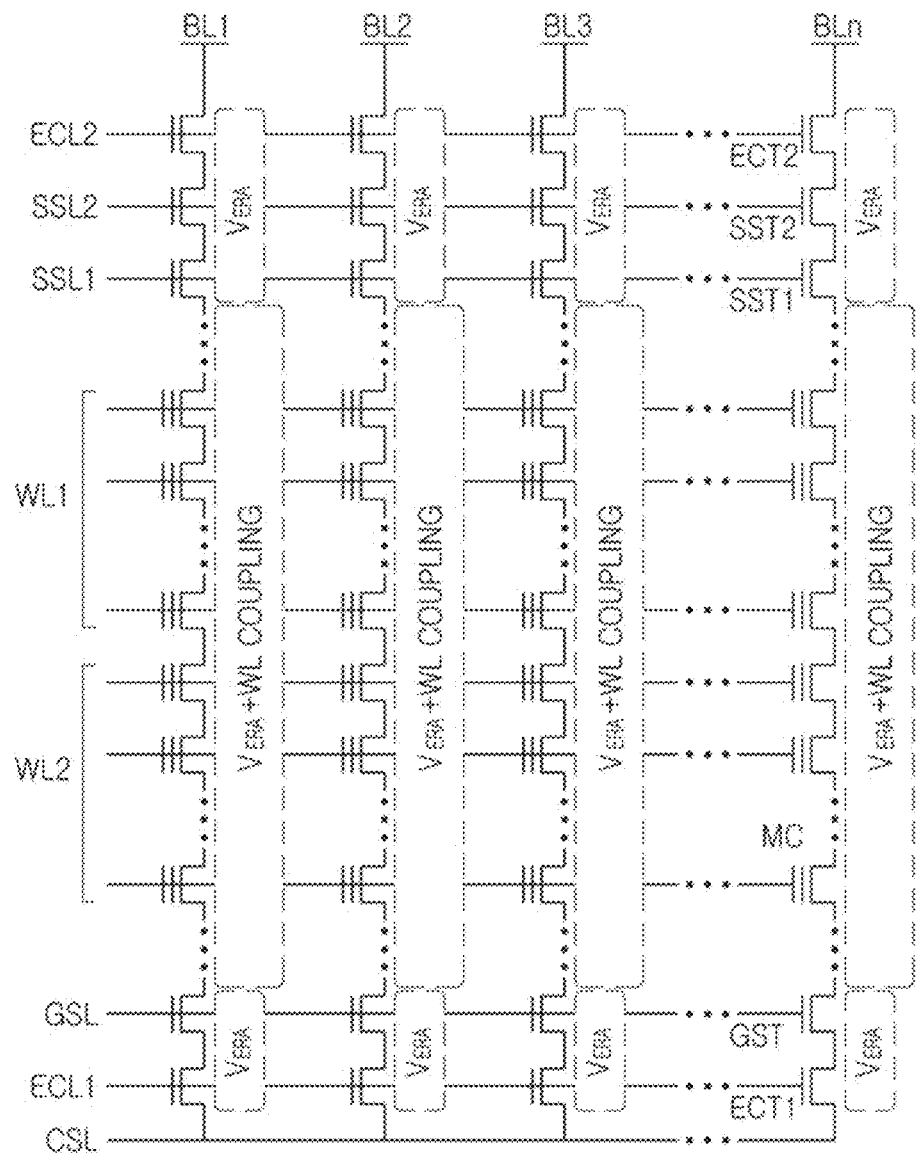

FIGS. 10 to 12 are diagrams illustrating comparative examples for describing an operation of a memory device according to example embodiments.

Referring to FIG. 10 first to describe the erase operation according to the comparative example, the erase voltage $V_{ERA}$ is input to the common source line CSL and the bit lines BL, and the voltage of the word lines WL may increase during the erase time $T_{ERA}$. Referring to FIG. 10, the voltage of the second word line WL2 first increases at a first time point, i.e., time t1, and the voltage of the first word line WL1 may increase at a second time point, i.e., time t2, that is later than the first time point, i.e., time t1. Accordingly, in the memory cells connected to the first word line WL1, a strong erase operation is performed until the first time point, i.e., time t1, and in the memory cells connected to the second word line WL2, a strong erase operation may be performed until the second time point, i.e., time t2.

Referring to FIG. 11, in a memory block in which an erase operation is performed, a voltage of a channel layer included in each of the memory cell strings may increase to the erase voltage $V_{ERA}$. When the voltage of the second word lines WL2 increases at the first time point, i.e., time t1, as illustrated in FIG. 12 the voltage of the channel layer may increase to a level higher than the erase voltage $V_{ERA}$ by the coupling effect between the second word lines WL2 and the channel layer.

Since the voltage of the channel layer has a higher level than the erase voltage $V_{ERA}$ input to the bit lines BL and the common source line CSL, holes may not be smoothly injected into the channel layer. Alternatively, in the case in which the hole is smoothly injected into the channel layer after the first time point, i.e., time t1, a very strong erase operation may proceed up to the second time point, i.e., time t2, after the first time point, i.e., time t1, in the memory cells connected to the first word lines WL1. Accordingly, a difference in distribution of threshold voltages of memory cells may increase after the erase operation. As a result, in the comparative example described with reference to FIGS. 10 to 12, the efficiency of the erase operation may decrease or the difference in threshold voltage distribution of the memory cells may increase, thereby deteriorating the performance of the memory device.

By contrast, in the example embodiments illustrated with respect to FIGS. 5-9, the voltage input to the word lines may be reduced from a high level to a low level during the erase operation. Accordingly, a phenomenon in which the voltage of the channel layer increases to a level higher than the erase voltage $V_{ERA}$ input from the peripheral circuit area to the cell area may be prevented, and the charge of the charge storage layer may be effectively removed during the erase operation, and a difference in distribution of threshold voltages of memory cells after the erase operation may be significantly reduced.

FIGS. 13 to 16 are diagrams provided to illustrate an operation of a memory device according to example embodiments.

Figure 13:
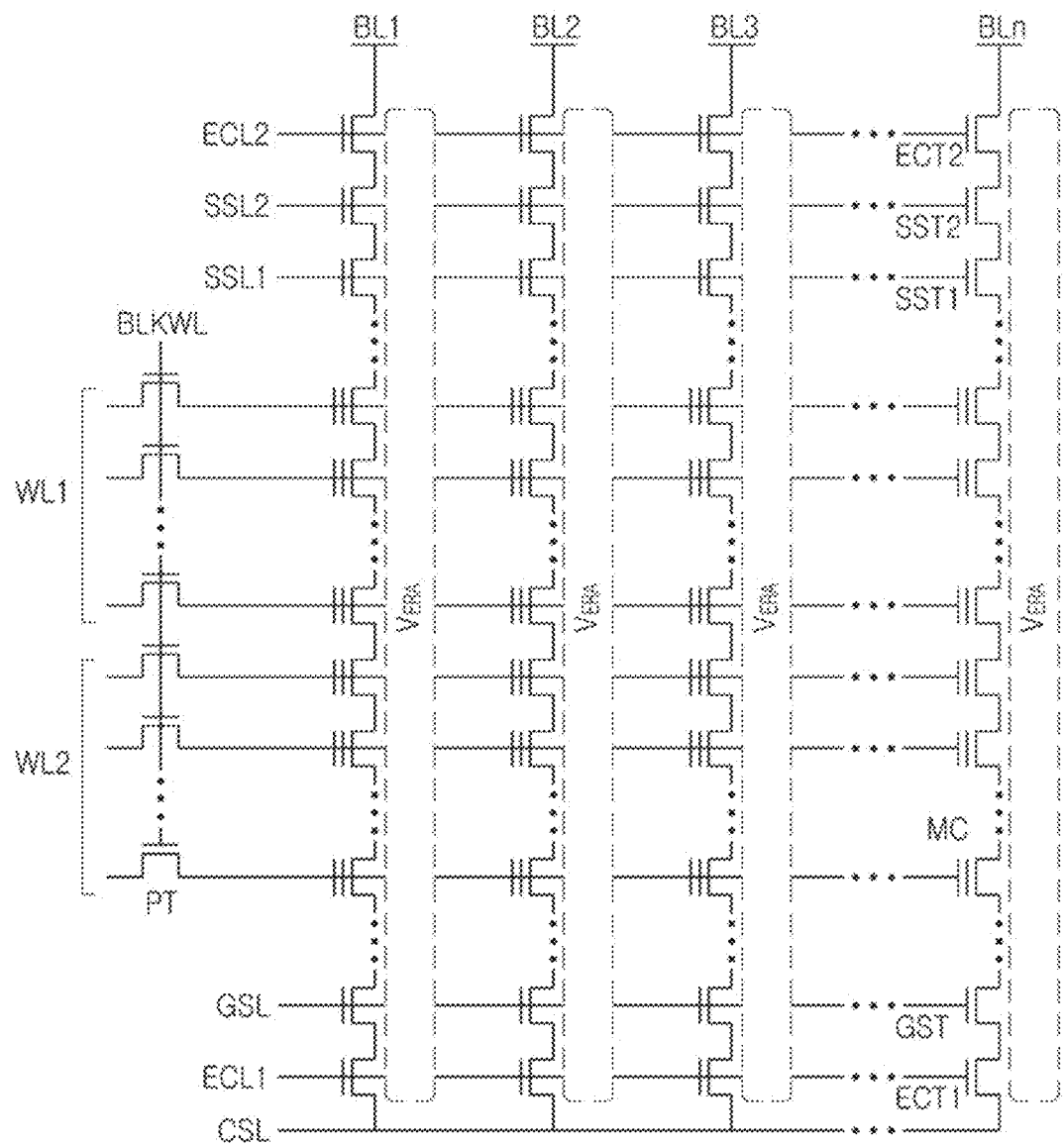
FIGS. 13 to 16 are diagrams illustrating an operation of a memory device according to example embodiments.

Referring to FIG. 13, a memory block of a memory device according to an example embodiment may include a plurality of memory cell strings, and the memory cell strings may be connected to bit lines BL1 to BLn and a common source line CSL. Each of the memory cell strings may include first and second erase control transistors ECT1 and ECT2, a ground selection transistor GST, memory cells MC, and string selection transistors SST1 and SST2. The memory cells MC are connected to word lines, and the word lines may include first word lines WL1 disposed in a relatively high position with respect to a substrate and second word lines WL2 disposed in a relatively low position with respect to the substrate.

The word lines may receive a voltage through a plurality of pass elements PT. The plurality of pass elements PT are disposed in the peripheral circuit area of the memory device, and may be turned on and off by a block word line control signal BLKWL. For example, pass elements PT connected to word lines included in one memory block may be simultaneously turned on and turned off by one block word line control signal BLKWL.

Figure 14:
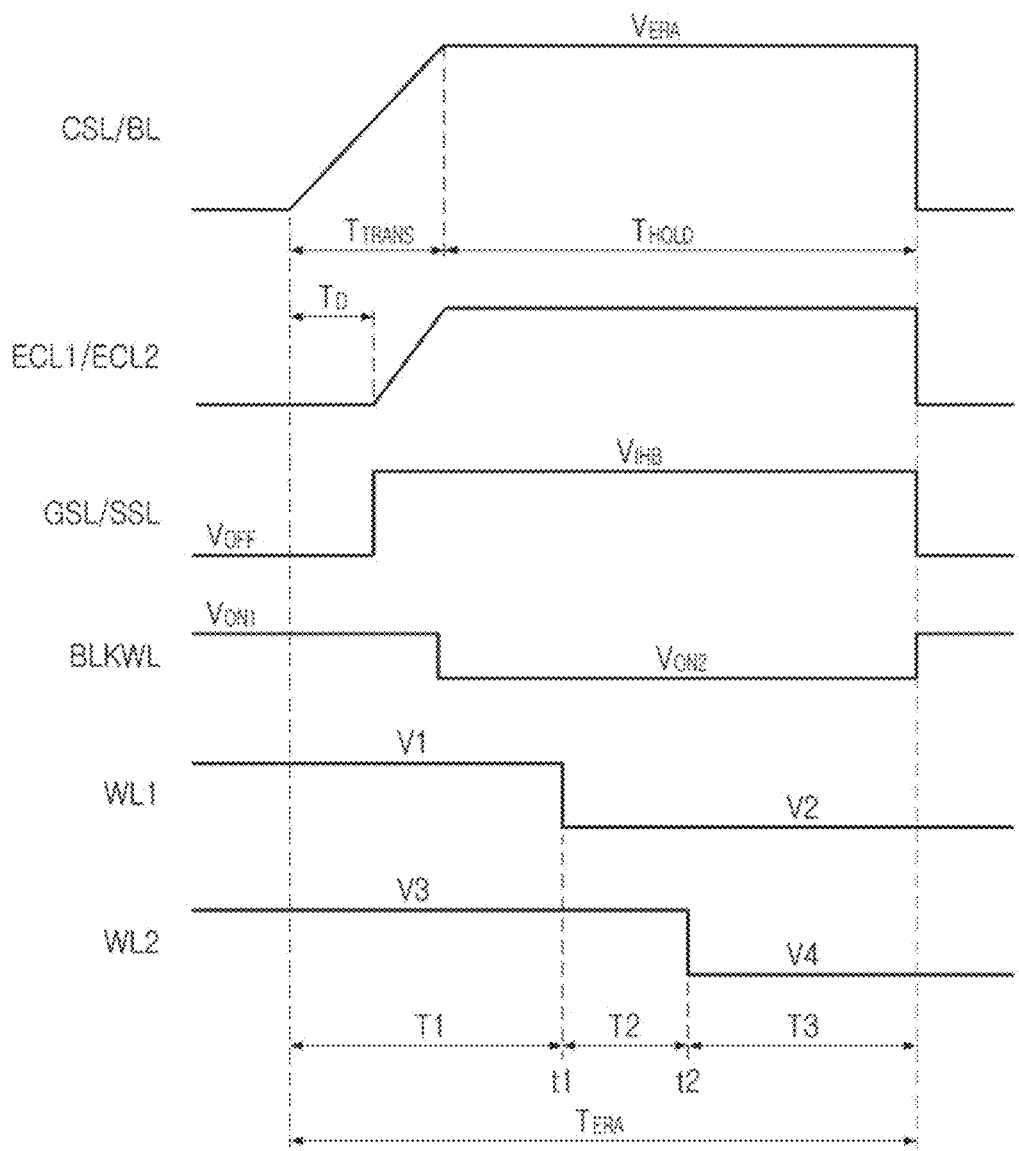

Hereinafter, an erase operation will be described with reference to FIGS. 13 and 14 together. Referring to FIG. 14, an erase voltage $V_{ERA}$ may be input to the common source line CSL and the bit lines BL. Alternatively, according to some example embodiments, the erase voltage $V_{ERA}$ may be input only to the common source line CSL or only to the bit lines BL. Voltages of the channel layers may increase due to the erase voltage $V_{ERA}$ input to the common source line CSL and the bit lines BL.

In addition, voltages for performing the erase operation may also be input to the erase control lines ECL1 and ECL2, the ground selection line GSL, the string selection line SSL, the first word lines WL1 and the second word lines WL2. The voltages input to the erase control lines ECL1 and ECL2, the ground selection line GSL, the string selection line SSL, the first word lines WL1 and the second word lines WL2 may be similar to those of the example embodiment described with reference to FIG. 6 above and thus a repeated description thereof is omitted for conciseness.

For example, the voltage of the first word lines WL1 may decrease from the first bias voltage V1 to the second bias voltage V2 at a first time point, i.e., time t1, and the voltage of the second word lines WL2 may decrease from the third bias voltage V3 to the fourth bias voltage V4 at a second time point, i.e., time t2, that is later than the first time point, i.e., time t1. Accordingly, in the memory cells connected to the first word lines WL1 disposed in a relatively high position, a strong erase operation is performed during the second time period T2 and the third time period T3, and in the memory cells connected to the second word lines WL2 disposed in a relatively low position, a strong erase operation may be performed only during the third time period T3.

The memory cells connected to the first word lines WL1 may include a charge storage layer having a relatively larger volume, compared to that of the memory cells connected to the second word lines WL2. By performing a strong erase operation for a longer period of time on the memory cells connected to the first word lines WL1, charges in the charge storage layer having a relatively large volume may be effectively removed, and the difference in threshold voltage distribution of the memory cells may be reduced.

Referring to FIG. 14, the level of the block word line control signal BLKWL input to the gates of the pass elements PT may be a first turn-on voltage $V_{ON1}$ during the transition period $T_{TRANS}$, and may be a second turn-on voltage $V_{ON2}$ lower than the first turn-on voltage $V_{ON1}$ during the hold period $T_{HOLD}$. Both the first turn-on voltage $V_{ON1}$ and the second turn-on voltage $V_{ON2}$ may be voltages capable of turning on the pass elements PT.

In detail, the pass elements PT may be turned-on more strongly during the transition period $T_{TRANS}$ than the hold period $T_{HOLD}$. Accordingly, as the voltage of the common source line CSL and the bit lines BL increases during the transition period $T_{TRANS}$, the coupling component generated between the channel layer and the word lines may be effectively removed through the pass elements PT. When the transition period $T_{TRANS}$ elapses, the voltages of the common source line CSL and the bit lines BL may be maintained as the erase voltage $V_{ERA}$, and a coupling effect between the channel layer and the word lines may be reduced. Therefore, during the hold period $T_{HOLD}$, the level of the block word line control signal BLKWL may be reduced to the second turn-on voltage $V_{ON2}$ such that the bias voltages V1-V4 for the erase operation may be input to the word lines.

Figure 15:
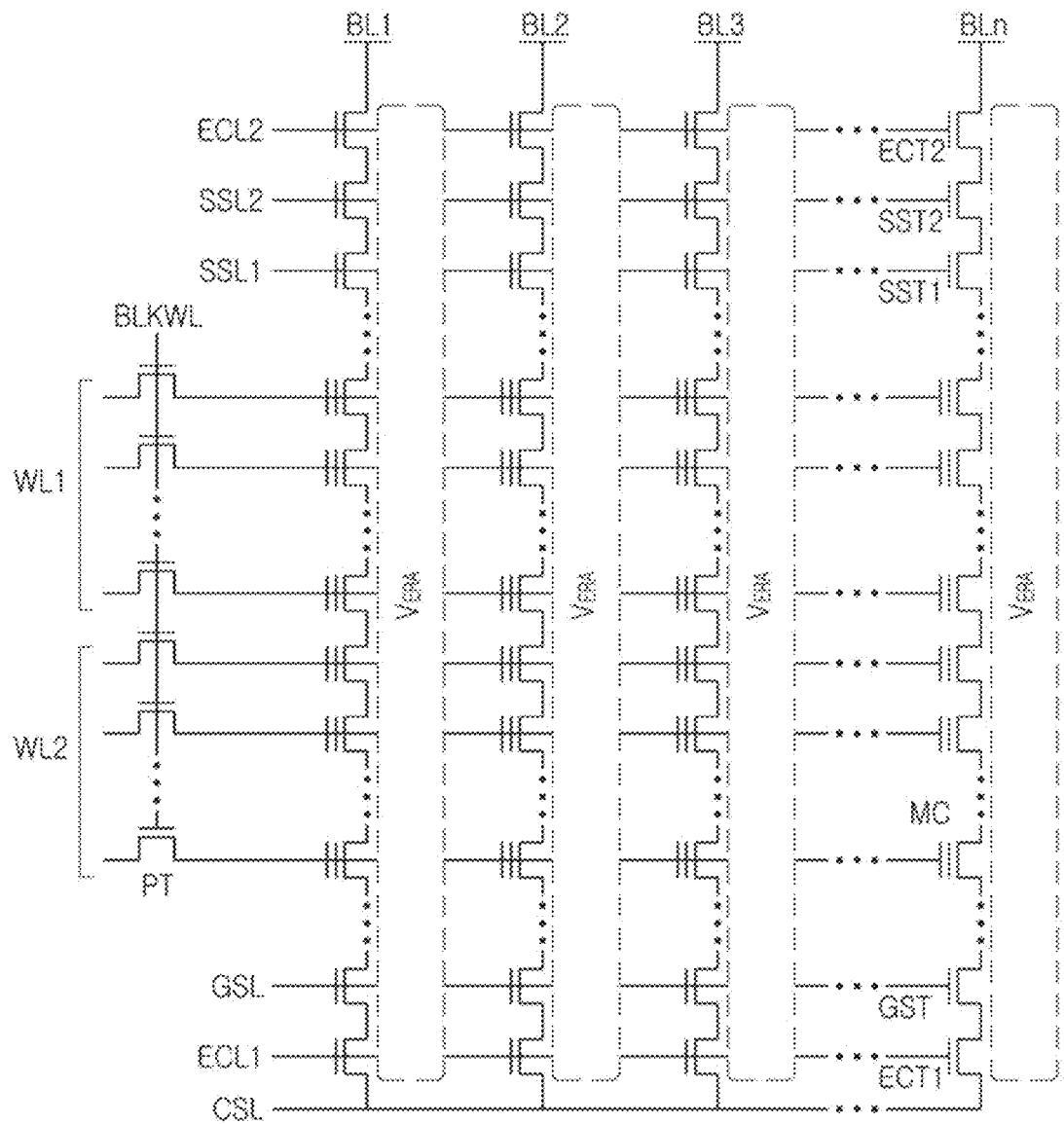

Referring to FIGS. 14 and 15 together, the erase voltage $V_{ERA}$ is input to the common source line CSL and/or the bit lines BL1-BLn, and the voltage of the channel layers may increase to the erase voltage $V_{ERA}$. While the voltage of the channel layers increases, the coupling component generated between the channel layers and the word lines WL1 and WL2 may be removed through the pass elements PT that are strongly turned on by the first turn-on voltage $V_{ON1}$.

Figure 16:
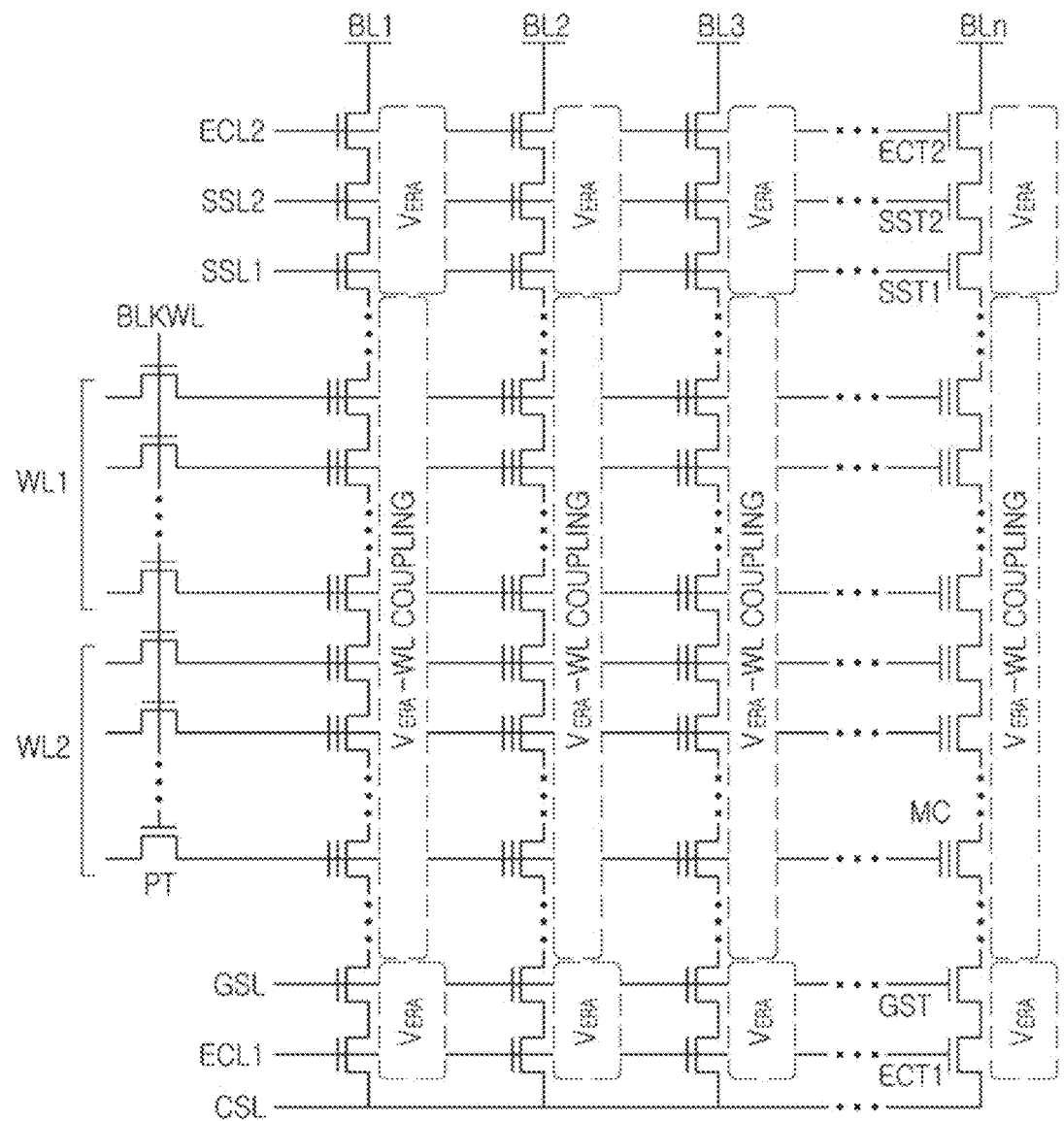

Referring to FIGS. 14 and 16, the voltage of the first word lines WL1 may decrease from the first bias voltage V1 to the second bias voltage V2 at the first time point, i.e., time t1. Accordingly, after the first time point, i.e., time t1, the erase operation may be rapidly performed in the memory cells connected to the first word lines WL1. On the other hand, as the voltage of the first word lines WL1 decreases to the second bias voltage V2, the voltage of a first channel layer adjacent to the word lines WL1 and WL2 among the channel layers and shared by the memory cells MC may be reduced. On the other hand, the voltage of the second channel layer adjacent to the first and second erase control lines ECL1 and ECL2 may be maintained as the erase voltage $V_{ERA}$. The second channel layer may have a conductivity type different from that of the first channel layer.

Since the voltage of the second channel layer has a higher level than that of the first channel layer after the first time point, i.e., time t1 when the voltage of the first word lines WL1 decreases to the second bias voltage V2, the holes may be smoothly introduced into the first channel layer, and an erase operation of the memory cells MC may be effectively performed. On the other hand, the suppression voltage $V_{IHB}$ may be applied to the ground selection line GSL and the string selection line SSL, such that the erase operation is suppressed in the ground selection transistor GST and the string selection transistors SST1 and SST2 that do not store data.

Figure 17:
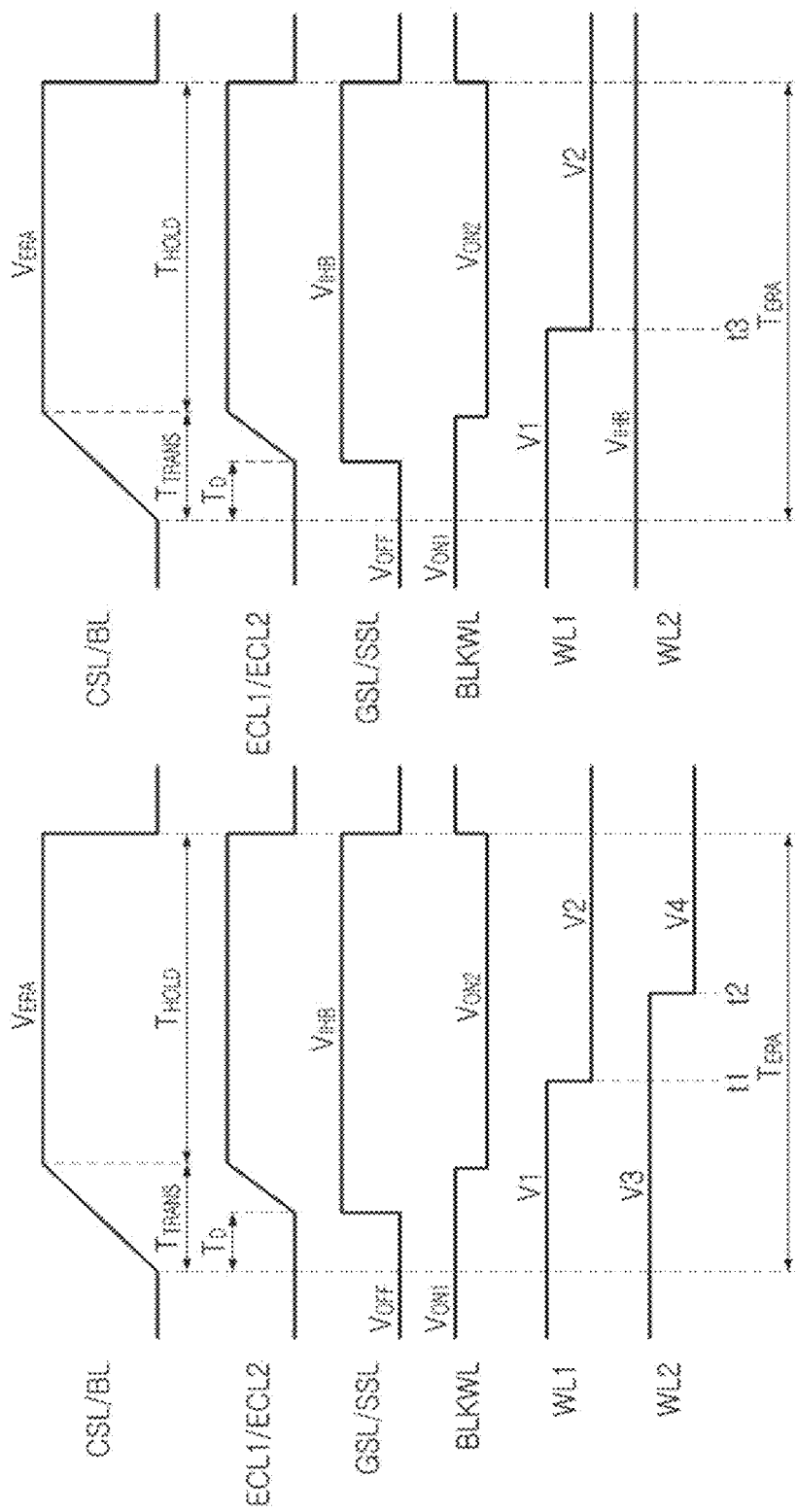
FIGS. 17 and 18 are schematic diagrams illustrating a memory device according to an example embodiment.
Figure 18:
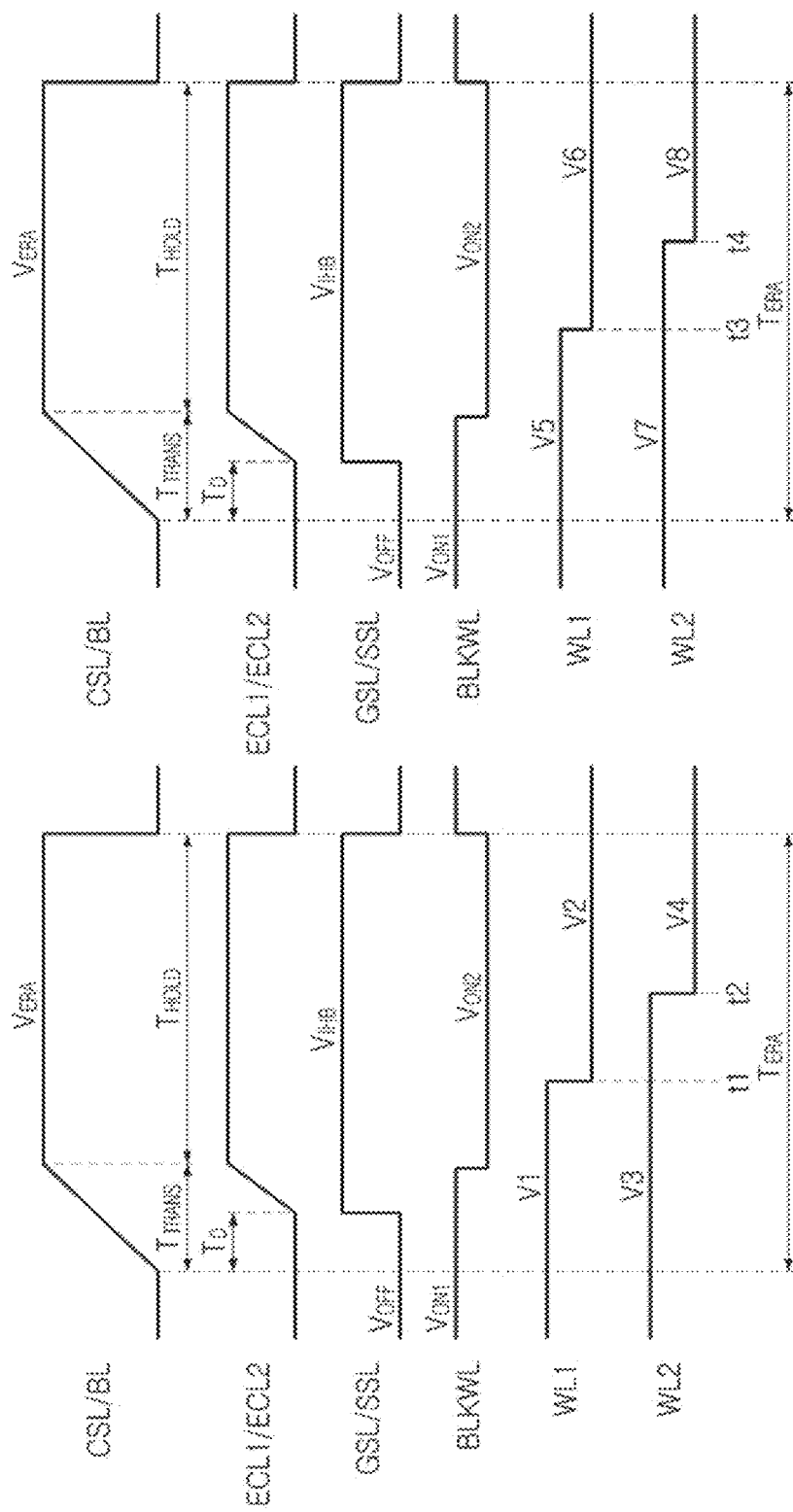

FIGS. 17 and 18 are diagrams provided to illustrate an operation of a memory device according to an example embodiment.

In example embodiments illustrated in FIGS. 17 and 18, two erase operations may be performed. However, this is only an example and, in some example embodiments, three or more erase operations may also be performed.

Referring to FIG. 17, a first erase operation (illustrated on the left hand side in FIG. 17) may be the same as described with reference to FIG. 14 and accordingly a repeated description thereof is omitted for conciseness. When the first erase operation is finished, the peripheral circuit area of the memory device may perform a verification operation to verify whether all data has been deleted from the memory cells of a target memory block that is the target of the erase operation. As an example, the peripheral circuit area may determine whether or not the threshold voltages of memory cells of the target memory block are lower than or equal to a target voltage. The target voltage may be predetermined.

When, as a result of the verification operation, among the memory cells of the target memory block, a memory cell of which a threshold voltage has not decreased to a level equal to or less than that of the target voltage exists, the peripheral circuit area may perform a second erase operation. The second erase operation may be similar to the first erase operation. However, in the second erase operation, the erase operation may be suppressed in some memory cells.

Referring to FIG. 17, in the second erase operation (illustrated on the right hand side of FIG. 17), the suppression voltage $V_{IHB}$ may be input to the second word lines WL2. For example, the suppression voltage $V_{IHB}$ may be input to the second word lines WL2 during the erase time $T_{ERA}$. The second word lines WL2 may be word lines connected to memory cells in which all data is erased by the first erase operation and a threshold voltage is reduced to a target voltage or less.

In the second erase operation, the voltage of the first word lines WL1 may decrease from the first bias voltage V1 to the second bias voltage V2. For example, the peripheral circuit area may reduce the voltage of the first word lines WL1 to the second bias voltage V2 at a third time point, i.e., time t3, during the second erase operation. The third time point, i.e., time t3 during the second erase operation may be the same as or different from the first time point, i.e., time t1, during the first erase operation. In other words, a time from the beginning of the transition period $T_{TRANS}$ of the first erase operation to the time t1 may be the same as or different from a time from the beginning of the transition period $T_{TRANS}$ of the second erase operation to the time t3. Also, according to example embodiments, the first erase time $T_{ERA1}$ and the second erase time $T_{ERA2}$ may be the same or different from each other. For example, according to the verification result of the verification operation, the second erase time $T_{ERA2}$ may be set to be shorter or longer than the first erase time $T_{ERA1}$.

In the example embodiment illustrated in FIG. 18, the first erase operation and the second erase operation may be similar. The first erase operation (illustrated on the left hand side of FIG. 18) may be the same as that in the example embodiment described with reference to FIG. 14 above and accordingly a repeated description thereof is omitted for conciseness. In the second erase operation (illustrated on the right hand side of FIG. 18), the voltage of the first word lines WL1 decreases from a fifth bias voltage V5 to a sixth bias voltage V6 at the third time point, i.e., time t3, and the voltage of the second word lines WL2 may decrease from a seventh bias voltage V7 to an eighth bias voltage V8 at a fourth time point, i.e., time t4, that is later than the third time point, i.e., time t3. The third point in time t3 and the fourth point in time t4 may be set to be equal to or different from the first point in time t1 and the second point in time t2, respectively. In other words, times from the beginning of the transition period $T_{TRANS}$ of the first erase operation to the time t1 and time t2 may be the same as or different from times from the beginning of the transition period $T_{TRANS}$ of the second erase operation to the time t3 and time t4, respectively.

According to example embodiments, the fifth bias voltage V5 may have a level different from the first bias voltage V1, and the sixth bias voltage V6 may have a different level from the second bias voltage V2. Also, the seventh bias voltage V7 may have a different level from the third bias voltage V3, and the eighth bias voltage V8 may have a different level from the fourth bias voltage V4.

For example, when it is determined that the threshold voltages of the memory cells have not been sufficiently reduced in the verification operation after the first erase operation, the levels of the fifth to eighth bias voltages V5-V8 may be set to perform a stronger erase operation in the second erase operation. For example, the fifth bias voltage V5 may have a level less than the first bias voltage V1 or the sixth bias voltage V6 may have a level less than the second bias voltage V2.

Conversely, in the verification operation after the first erase operation, when it is determined that the threshold voltage of the memory cells is mostly set below the target voltage and only fine adjustment of the threshold voltage distribution is necessary, the levels of the fifth to eighth bias voltages V5-V8 may be set such that a relatively weak erase operation is performed In the second erase operation. For example, the fifth bias voltage V5 may have a level greater than the first bias voltage V1, or the sixth bias voltage V6 may have a level greater than the bias voltage V2.

In addition, according to example embodiments, the example embodiment described with reference to FIG. 17 and the example embodiment described with reference to FIG. 18 may be applied together. For example, in the second erase operation, the suppression voltage $V_{IHB}$ may be input to the second word lines WL2, and the voltage of the first word lines WL1 may be reduced from the fifth bias voltage V5 to the sixth bias voltage V6 at the third time point, i.e., time t3. On the other hand, in the example embodiments described with reference to FIGS. 17 and 18, the erase voltage $V_{ERA}$ input to the common source line CSL and the bit lines BL may have the same level in the first erase operation and the second erase operation.

Figure 19:
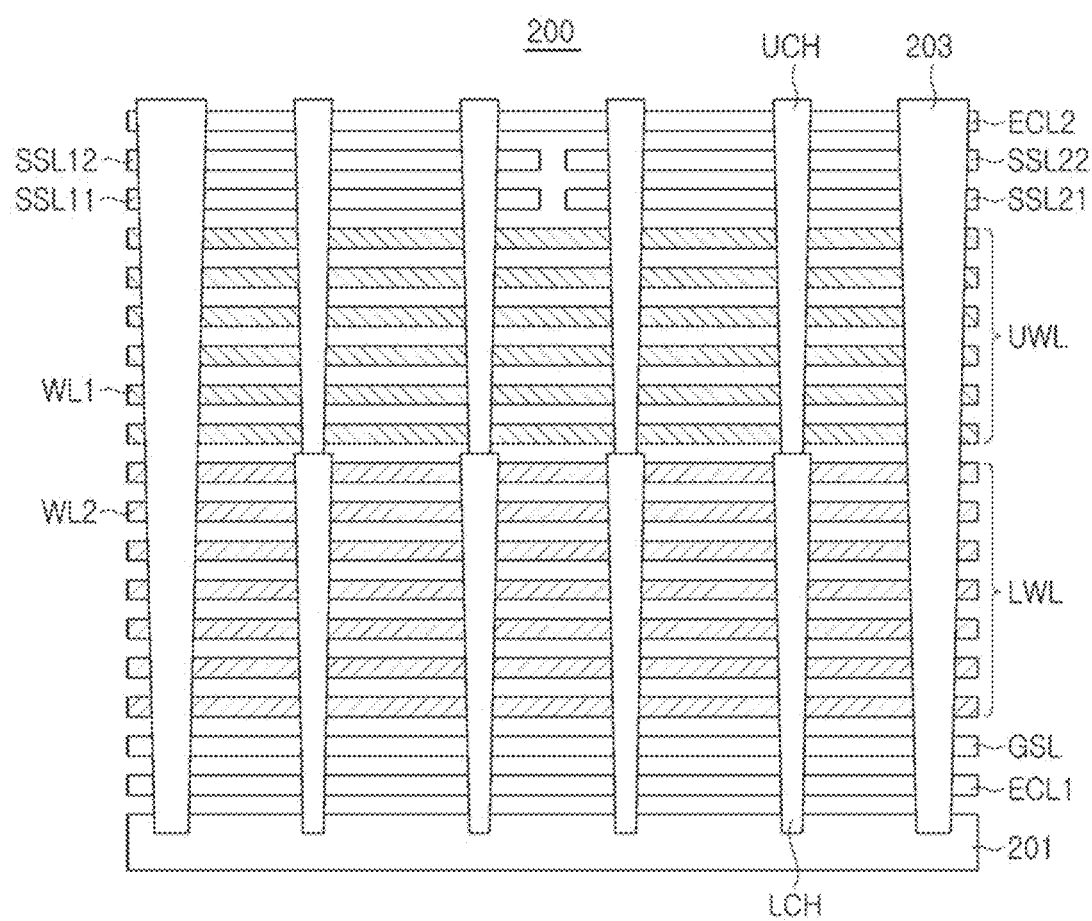
FIG. 19 is a schematic diagram of a memory device according to an example embodiment.

FIG. 19 is a schematic diagram of a memory device according to an example embodiment.

FIG. 19 may be a simplified diagram illustrating a cell area of a memory device 200 according to an example embodiment. The memory device 200 may correspond to the memory device 10 described above. Referring to FIG. 19, a cell area may include a substrate 201, a ground selection line GSL, word lines LWL and UWL, string selection lines SSL11, SSL12, SSL21, and SSL22, erase control lines ECL1 and ECL2, channel structures, separation layers 203, and the like.

In the example embodiment illustrated in FIG. 19, each of the channel structures may have an upper channel structure UCH and a lower channel structure LCH. The lower channel structure LCH penetrates through the lower word lines LWL and is connected to the substrate 201, and the upper channel structure UCH may penetrate through the upper word lines UWL and may be connected to the lower channel structure LCH. Accordingly, a profile of each of the channel structures may appear differently compared to the example embodiment illustrated in FIG. 5.

Since the profile of each of the channel structures is different from that of the example embodiment illustrated in FIG. 5, the bias voltage input to the word lines LWL and UWL in the erase operation may also be different from that described with reference to FIG. 6. Hereinafter, this configuration will be described with reference to FIGS. 19-20 together.

Figure 20:
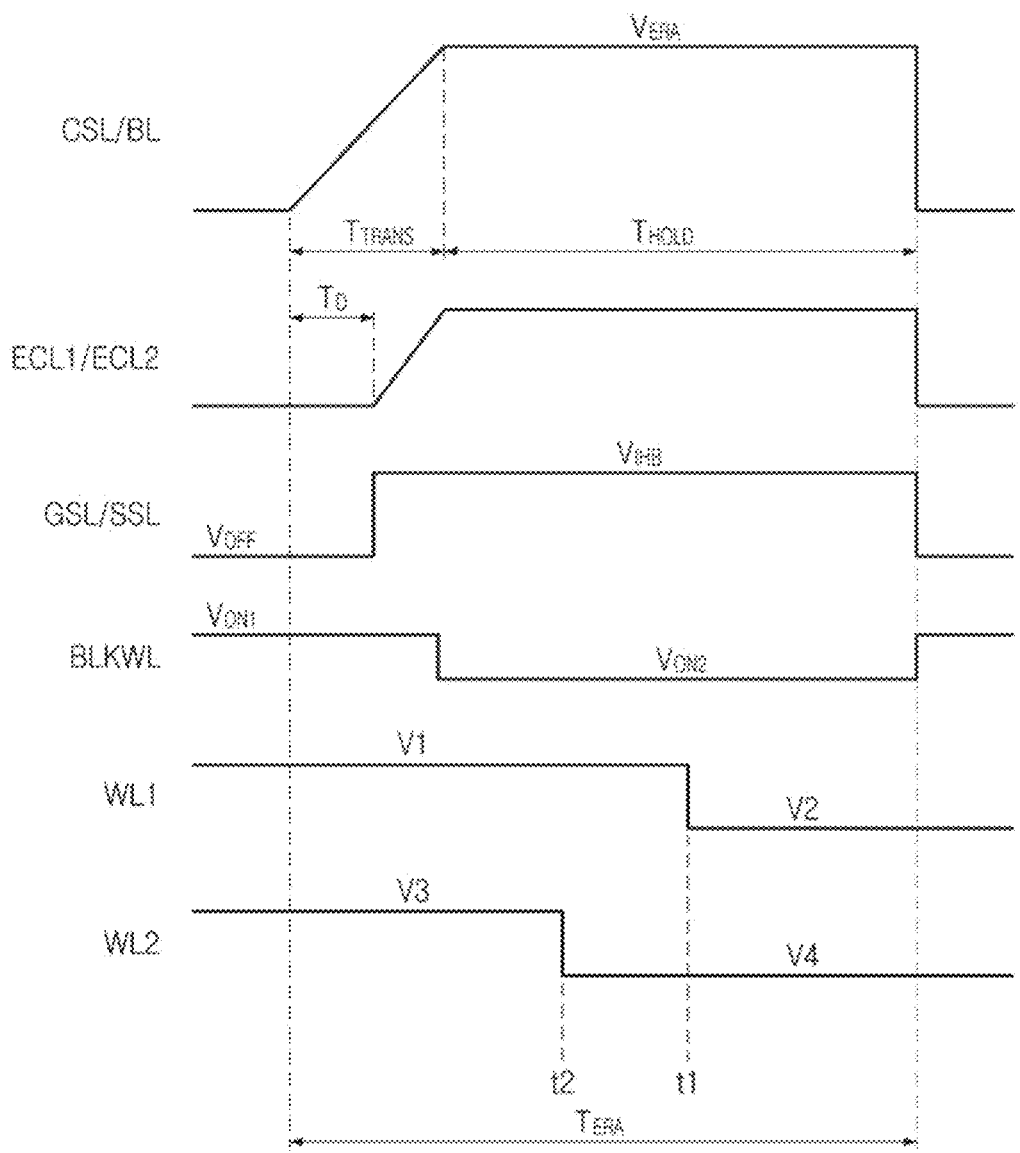
FIG. 20 is a diagram illustrating an operation of a memory device according to example embodiments.

FIG. 20 is a diagram provided to illustrate an operation of a memory device according to example embodiments.

Referring to FIG. 20, in an erase operation, an erase voltage $V_{ERA}$ may be input to a common source line CSL through a substrate 201. However, according to example embodiments, the erase voltage $V_{ERA}$ may also be input to the bit lines BL connected to the upper channel structure UCH above the respective channel structures. The erase time $T_{ERA}$ may include a transition period $T_{TRANS}$ in which the voltage of the channel layer included in the upper channel structure UCH and the lower channel structure LCH increases to the erase voltage level $V_{ERA}$, and a hold period $T_{HOLD}$ in which the voltage of the channel layer is maintained as the erase voltage $V_{ERA}$. The voltages of the erase control lines ECL1 and ECL2 are maintained at a level, which may be predetermined, for example, a ground level during the delay time $T_D$, and may float after the delay time $T_D$ elapses. A turn-off voltage $V_{OFF}$ and a suppression voltage $V_{IHB}$ may be sequentially input to the ground selection line GSL and the string selection line SSL.

Referring to FIG. 19, a first word line WL1 may be one of upper word lines UWL, and a second word line WL2 may be one of lower word lines LWL. Also, according to the respective locations of the first and second word lines WL1 and WL2, in some cases a diameter of the upper channel structure UCH adjacent to the first word line WL1 may be less than the diameter of the lower channel structure LCH adjacent to the second word line WL2. Accordingly, although the first word line WL1 is disposed above the second word line WL2, the erase operation may be performed such that the strong erase operation is performed longer on the second word line WL2.

Referring to FIG. 20, a first time point, i.e., time t1, at which the voltage of the first word line WL1 decreases from the first bias voltage V1 to the second bias voltage V2 may be later than the second time point, i.e., time t2, at which the voltage of the second word line WL2 decreases from the third bias voltage V3 to the fourth bias voltage V4. Compared with the example embodiment of FIGS. 5 and 6 in which each of the channel structures does not include the upper channel structure UCH and the lower channel structure LCH, the voltage of the second word line WL2 located in a relatively lower position may be first reduced, rather than the voltage of the first word line WL1 located in a relatively upper position. Accordingly, a strong erase operation may be performed longer in the memory cells connected to the second word line WL2 than in the memory cells connected to the first word line WL1.

Figure 21:
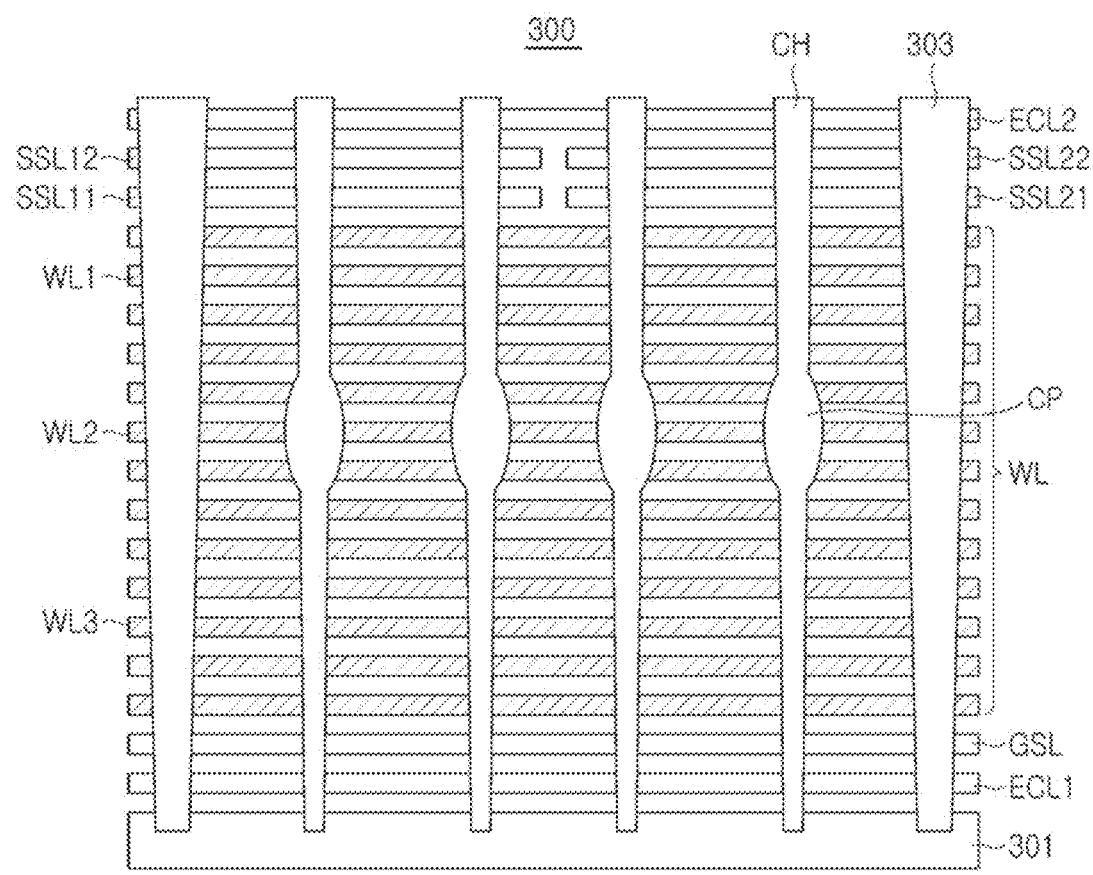
FIG. 21 is a schematic diagram of a memory device according to an example embodiment.

FIG. 21 is a schematic diagram of a memory device according to an example embodiment.

FIG. 21 may be a simplified diagram illustrating a cell area of a memory device 300 according to an example embodiment. The memory device 300 may correspond to the memory device 10 described above. Referring to FIG. 21, a cell area may include a substrate 301, a ground selection line GSL, word lines WL, string selection lines SSL11, SSL12, SSL21, and SSL22, erase control lines ECL1 and ECL2, channel structures, separation layers 303, and the like.

In the example embodiment illustrated in FIG. 21, each of the channel structures CH may have a convex portion CP. For example, the convex portion CP may be provided at the same height as some of the word lines WL. As the convex portions CP are generated, the profile of each of the channel structures CH may be different from the example embodiments described with reference to FIGS. 5 and 19. Also, the bias voltage input to the word lines WL during the erase operation may be different from the above-described embodiments. Hereinafter, this configuration will be described with reference to FIG. 22.

Figure 22:
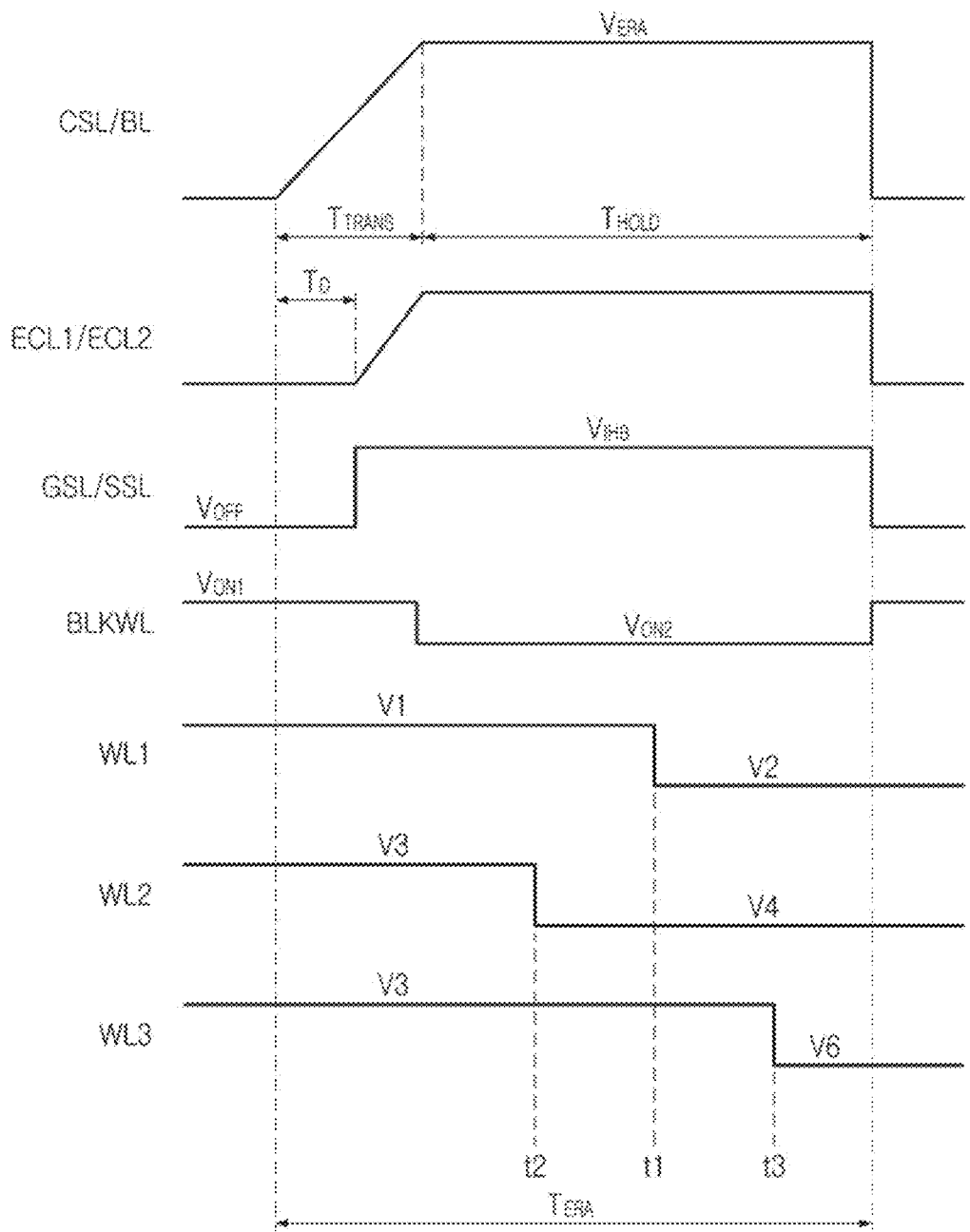
FIG. 22 is a diagram illustrating an operation of a memory device according to example embodiments.

FIG. 22 is a diagram provided to illustrate an operation of a memory device according to example embodiments.

Referring to FIG. 22, in an erase operation, an erase voltage $V_{ERA}$ may be input to a common source line CSL and/or bit lines BL. The erase time $T_{ERA}$ may include a transition period $T_{TRANS}$ in which the voltage of the channel layer included in a channel structure CH increases to the erase voltage level $V_{ERA}$, and a hold period $T_{HOLD}$ in which the voltage of the channel layer is maintained as the erase voltage $V_{ERA}$. The voltages of the erase control lines ECL1 and ECL2 are maintained at a level, which may be predetermined, for example, a ground level during the delay time $T_D$, and may float after the delay time $T_D$ elapses. A turn-off voltage $V_{OFF}$ and a suppression voltage $V_{IHB}$ may be sequentially input to the ground selection line GSL and the string selection line SSL.

Referring to FIG. 21, the first word line WL1 may be a word line that is disposed to be higher from the substrate 301 than the convex portion CP, and the second word line WL2 may be a word line adjacent to the convex portion CP. On the other hand, the third word line WL3 may be a word line disposed to be lower from the substrate 301 than the convex portion CP. Although the second word line WL2 is disposed below the first word line WL1, the second word line WL2 may be adjacent to a charge storage layer and a channel layer having a relatively large volume formed in the convex portion CP. Accordingly, a strong erase operation may be performed on the memory cells connected to the second word line WL2 for a relatively longer period of time.

Referring to FIG. 22, a first time point, i.e., time t1, at which the voltage of the first word line WL1 decreases from the first bias voltage V1 to the second bias voltage V2 may be later than a second time point, i.e., time t2, at which the voltage of the second word line WL2 decreases from the third bias voltage V3 to the fourth bias voltage V4. Also, a third time point, i.e., time t3, at which the voltage of the third word line WL3 decreases from the fifth bias voltage V5 to the sixth bias voltage V6 may be later than the first time point, i.e., time t1. Accordingly, the time during which a strong erase operation is performed in the memory cells connected to the second word line WL2 may be longer than the time during which a strong erase operation is performed in the memory cells connected to the first word line WL1 and the memory cells connected to the third word line WL3.

Figure 23:
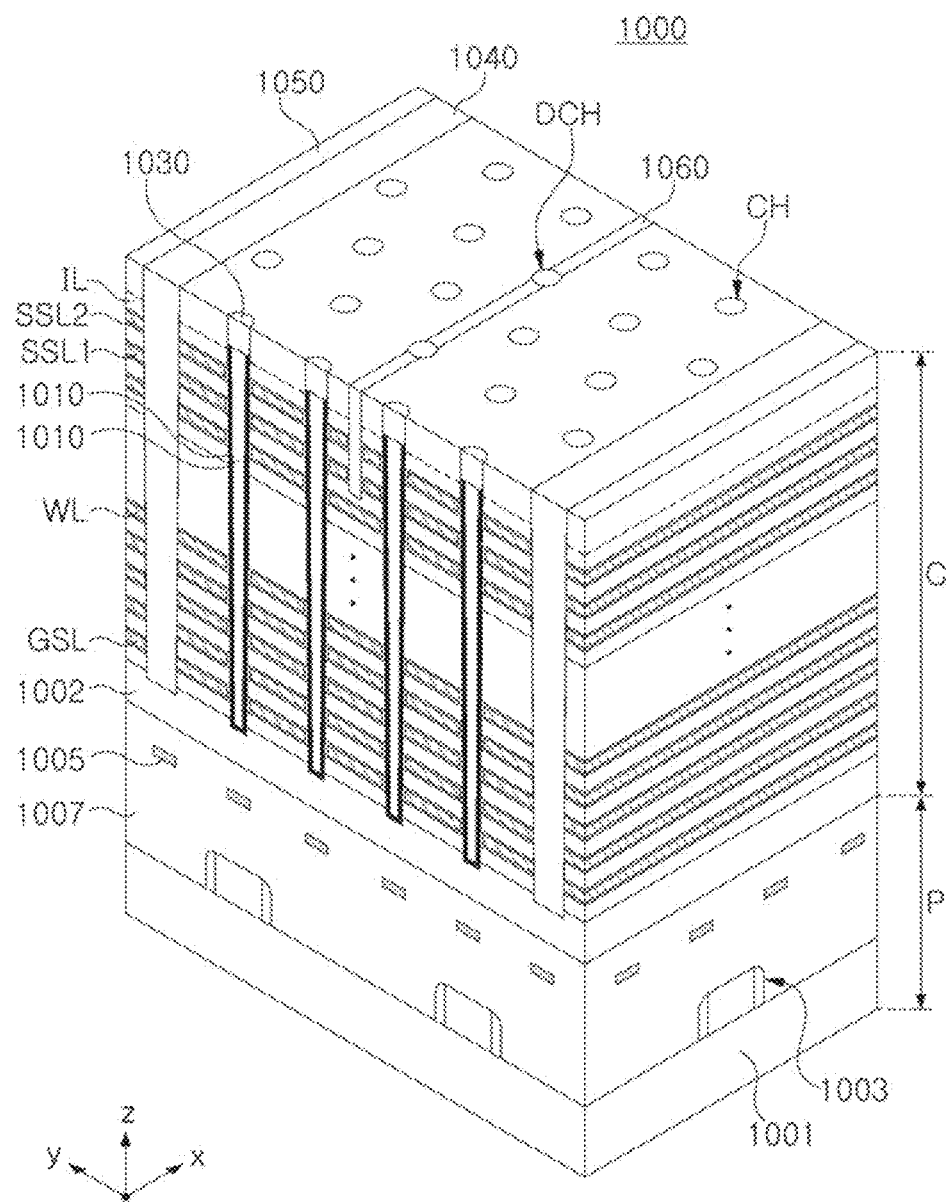
FIGS. 23 and 24 are diagrams schematically illustrating a memory device according to an example embodiment.
Figure 24:
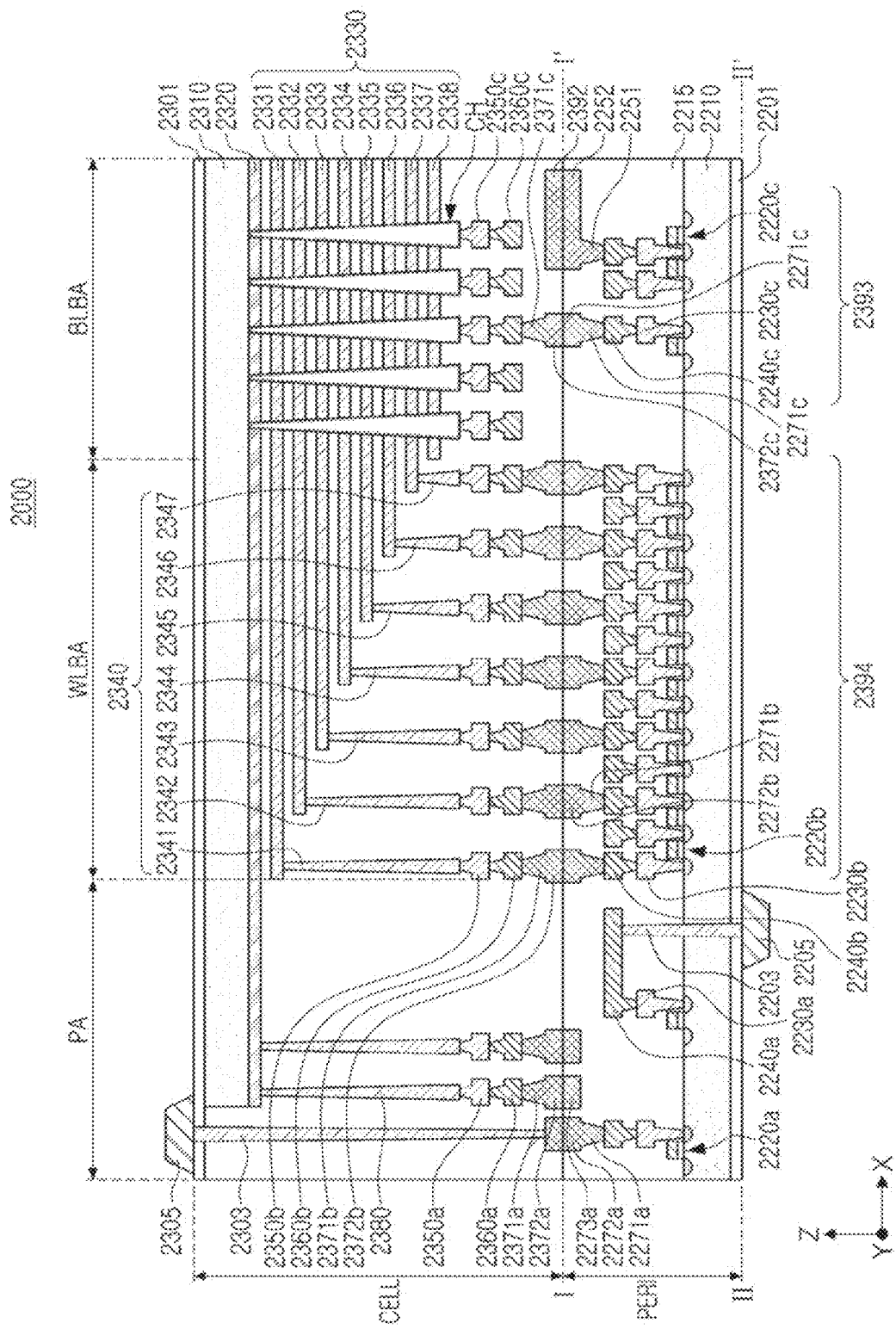

FIGS. 23 and 24 are diagrams schematically illustrating a memory device according to an example embodiment.

Each of memory devices 1000 and 2000 according to example embodiments illustrated in FIGS. 23 and 24 may execute an erase operation according to various embodiments described above. As an example, bias voltages are input to word lines during an erase time at which an erase voltage is input to a common source line and/or bit lines, and a timing of adjusting the bias voltage input to at least some of the word lines may be differently determined.

In addition, by reducing the bias voltage of the word lines from a high level to a low level during the erase operation, the voltage of the channel layer may be prevented from increasing to a level higher than the erase voltage input to the common source line and/or bit lines. Therefore, the efficiency of the erase operation may increase by smoothly flowing the hole into the channel layer during the erase operation, and the performance of the memory device may be improved by reducing the difference in threshold voltage distribution of the memory cells.

FIG. 23 is a perspective view illustrating the memory device 1000 according to an example embodiment. Referring to FIG. 23, the memory device 1000 according to an example embodiment may include a cell area C and a peripheral circuit area P. The cell area C may be disposed above the peripheral circuit area P. The peripheral circuit area P may be disposed below the cell area C, the peripheral circuit area P may include a first substrate 1001, and the cell area C may include a second substrate 1002 different from the first substrate 1001.

For example, the peripheral circuit area P may include a plurality of peripheral circuit elements 1003 provided on the first substrate 1001, a plurality of wiring lines 1005 connected to the peripheral circuit elements 1003, a first interlayer insulating layer 1007 covering the peripheral circuit elements 1003 and the wiring lines 1005, and the like. Peripheral circuits used for driving the memory device 1000, for example, a page buffer, a row decoder, an SI controller, a charge pump, and a control logic, may be disposed in the peripheral circuit area P.

The second substrate 1002 included in the cell area C may be disposed on the first interlayer insulating layer 1007. The cell area C may include a ground selection line GSL, word lines WL, string selection lines SSL1 and SSL2, and a plurality of insulating layers IL stacked on the second substrate 1002. The insulating layers IL may be alternately stacked with the ground selection line GSL, the word lines WL, and the string selection lines SSL1 and SSL2. The number of the ground selection line GSL and the number of the string selection lines SSL1 and SSL2 are not limited to that illustrated in FIG. 23 and may be variously modified.

In addition, the cell area C may include channel structures CH extending in a first direction (Z-axis direction) perpendicular to the upper surface of the second substrate 1002, and the channel structures CH may penetrate through the ground selection line GSL, the word lines WL, and the string selection lines SSL1 and SSL2 and be connected to the second substrate 1002. The channel structures CH may include a channel layer 1010, a buried insulating layer 1020 filling an inner space of the channel layer 1010, a bit line connection layer 1030, and the like. The channel layer 1010 may be electrically connected to a common source line formed on the second substrate 1002. For example, a common source line may be formed in the second substrate 1002, and the channel layer 1010 may be formed to contact the common source line. A lower surface and/or a side surface of the channel layer 1010 may be in contact with the common source line. Further, the channel layer 1010 may be connected to at least one bit line through the bit line connection layer 1030.

At least one gate insulating layer (not shown) may be disposed on an outer side of the channel layer 1010. In an example embodiment, the gate insulating layer may include a tunneling layer, a charge storage layer, a blocking layer, and the like, which are sequentially disposed from the channel layer 1010. Depending on example embodiments, at least one of the tunneling layer, the charge storage layer, and the blocking layer may be formed in a shape surrounding the ground selection line GSL, the word lines WL, and the string selection lines SSL1 and SSL2.

The ground selection line GSL, the word lines WL, and the string selection lines SSL1 and SSL2 may be covered by an interlayer insulating layer 1050. Also, the ground selection line GSL, the word lines WL, and the string selection lines SSL1 and SSL2 may be divided into a plurality of memory blocks BLK1 and BLK2 by separation layers 1040. Each of the plurality of memory blocks BLK1 and BLK2 may be a unit area for performing an erase operation. In an example embodiment, between a pair of separation layers 1040 adjacent to each other in the second direction (Y-axis direction), the string selection lines SSL1 and SSL2 may be divided into a plurality of regions by an upper separation layer 1060.

In an example embodiment, dummy channel structures DCH may be provided in a region in which the upper separation layer 1060 is disposed. The dummy channel structures DCH may have the same structure as the channel structures CH, but may not be connected to a bit line.

Next, referring to FIG. 24, the memory device 2000 according to an example embodiment may have a chip to chip (C2C) structure. The C2C structure may indicate a structure in which an upper chip including a cell area (CELL) is fabricated on a first wafer, and a lower chip including a peripheral circuit area (PERI) is fabricated on a second wafer different from the first wafer, and then, the upper chip and the lower chip are connected to each other by a bonding method. For example, the bonding method may refer to a method of electrically connecting a bonding metal formed on an uppermost metal layer of the upper chip and a bonding metal formed on an uppermost metal layer of the lower chip. For example, when the bonding metal is formed of copper (Cu), the bonding method may be a Cu—Cu bonding method, and the bonding metal may be formed of aluminum or tungsten.

Each of the peripheral circuit area PERI and the cell area CELL of the memory device 2000 may include an external pad bonding area PA, a word line bonding area WLBA, and a bit line bonding area BLBA.

The peripheral circuit area PERI may include a first substrate 2210, an interlayer insulating layer 2215, a plurality of circuit elements 2220a, 2220b and 2220c formed on the first substrate 2210, first metal layers 2230a, 2230b and 2230c connected to the plurality of circuit elements 2220a, 2220b and 2220c, respectively, and second metal layers 2240a, 2240b and 2240c formed on the first metal layers 2230a, 2230b and 2230c. In an example embodiment, the first metal layers 2230a, 2230b and 2230c may be formed of tungsten having relatively high resistance, and the second metal layers 2240a, 2240b and 2240c may be formed of copper having relatively low resistance.

In the present specification, only the first metal layers 2230a, 2230b, and 2230c and the second metal layers 2240a, 2240b, and 2240c are illustrated and described, but example embodiments are not limited thereto, and at least one metal layer may be further formed on the second metal layers 2240a, 2240b and 2240c. At least a portion of one or more metal layers formed on the second metal layers 2240a, 2240b and 2240c may be formed of aluminum, or the like, having a lower resistance than that of copper forming the second metal layers 2240a, 2240b and 2240c.

The interlayer insulating layer 215 may be disposed on the first substrate 2210 to cover the plurality of circuit elements 2220a, 2220b and 2220c, the first metal layers 2230a, 2230b and 2230c, and the second metal layers 2240a, 2240b and 2240c, and may include an insulating material such as silicon oxide or silicon nitride.

Lower bonding metals 2271b and 2272b may be formed on the second metal layer 2240b of the word line bonding area WLBA. In the word line bonding area WLBA, the lower bonding metals 2271b and 2272b of the peripheral circuit area PERI may be electrically connected to the upper bonding metals 2371b and 2372b of the cell area CELL by a bonding method. The lower bonding metals 2271b and 2272b and the upper bonding metals 2371b and 2372b may be formed of aluminum, copper, or tungsten.

The cell area CELL may provide at least one memory block. The cell area CELL may include a second substrate 2310 and a common source line 2320. On the second substrate 2310, a plurality of word lines 2331-2338 (2330) may be stacked in a direction (Z-axis direction) perpendicular to the upper surface of the second substrate 2310. String selection lines and a ground selection line may be disposed on the upper and lower portions of the word lines 2330, respectively, and a plurality of word lines 2330 may be disposed between the string selection lines and the ground selection line.

In the bit line bonding area BLBA, the channel structure CH may extend in a direction perpendicular to the upper surface of the second substrate 2310 to penetrate through the word lines 2330, the string selection lines, and the ground selection line. The channel structure CH may include a data storage layer, a channel layer, and a buried insulating layer, and the channel layer may be electrically connected to the first metal layer 2350c and the second metal layer 2360c. For example, the first metal layer 2350c may be a bit line contact, and the second metal layer 2360c may be a bit line. In an example embodiment, the bit line 2360c may extend in a first direction (Y-axis direction) parallel to the upper surface of the second substrate 2310.

In the example embodiment illustrated in FIG. 24, an area in which the channel structure CH and the bit line 2360c are disposed may be defined as the bit line bonding area BLBA. The bit line 2360c may be electrically connected to the circuit elements 2220c providing the page buffer 2393 in the peripheral circuit area PERI in the bit line bonding area BLBA. As an example, the bit line 2360c may be connected to the upper bonding metals 2371c and 2372c in the peripheral circuit area PERI, and the upper bonding metals 2371c and 2372c may be connected to the lower bonding metals 2271c and 2272c connected to the circuit elements 2220c of the page buffer 393.

In the word line bonding area WLBA, the word lines 2330 may extend in a second direction (X-axis direction) parallel to the upper surface of the second substrate 2310, and may be connected to a plurality of cell contact plugs 2341-2347 (2340). The word lines 2330 and the cell contact plugs 2340 may be connected to each other on pads provided as at least some of the word lines 2330 extend in different lengths in the second direction. A first metal layer 2350b and a second metal layer 2360b may be sequentially connected on upper portions of the cell contact plugs 2340 connected to the word lines 2330. The cell contact plugs 2340 may be connected to the peripheral circuit area PERI through the upper bonding metals 2371b and 2372b of the cell area CELL and the lower bonding metals 2271*b* and 2272*b* of the peripheral circuit area PERI, in the word line bonding area WLBA.

The cell contact plugs 2340 may be electrically connected to the circuit elements 2220*b* providing the row decoder 2394 in the peripheral circuit area PERI. In an example embodiment, the operating voltages of the circuit elements 2220*b* providing the row decoder 2394 may be different from the operating voltages of the circuit elements 2220*c* providing the page buffer 2393. For example, operating voltages of the circuit elements 2220*c* providing the page buffer 2393 may be greater than the operating voltages of the circuit elements 2220*b* providing the row decoder 2394.

A common source line contact plug 2380 may be disposed in the external pad bonding area PA. The common source line contact plug 2380 may be formed of a conductive material such as a metal, a metal compound, or polysilicon, and may be electrically connected to the common source line 2320. A first metal layer 2350*a* and a second metal layer 2360*a* may be sequentially stacked on the common source line contact plug 2380. For example, an area in which the common source line contact plug 2380, the first metal layer 2350*a*, and the second metal layer 2360*a* are disposed may be defined as the external pad bonding area PA.

The erase voltage for performing the erase operation is generated in the peripheral circuit area PERI and may be input to the common source line 2320 through the common source line contact plug 2380. The erase voltage input to the common source line 2320 may be transmitted to a channel layer included in the channel structure CH. When the voltage of the channel layer increases due to the erase voltage and a bias voltage is input to the word lines 2330, the charge is removed from the data storage layer of the channel structure CH due to the voltage difference between the channel layer and the word lines 2330, and an erase operation may be performed. The bias voltage may be predetermined. According to various example embodiments, an erase voltage may also be input to the bit line 2360*c* such that the voltage of the channel layer may increase rapidly.

In an example embodiment, during an erase time at which the erase voltage is input to the common source line contact plug 2380, the voltage input to the word lines 2330 may decrease. The timing of decreasing the voltage of each of the word lines 2330 may be variously determined according to the height of each of the word lines 2330 in the memory block, the profile of the channel structure CH adjacent to each of the word lines 2330, or the like.

By appropriately controlling the timing of decreasing the voltage of each of the word lines 2330, the efficiency of the erase operation may be improved by preventing the voltage of the channel layer included in the channel structure CH from becoming higher than the erase voltage input to the common source line 2320. In addition, a difference in threshold voltage distribution of memory cells after the erase operation may be significantly reduced. Accordingly, the difference in threshold voltage distribution of the memory cells after the programming operation may also be reduced, and a margin in the threshold voltage distribution based on the program state of the memory cells may be evenly secured, thereby reducing errors that may occur in a reading operation or the like, and improving performance of the memory device 2000.

On the other hand, input/output pads 2205 and 2305 may be disposed in the external pad bonding area PA. Referring to FIG. 24, a lower insulating layer 2201 covering a lower surface of the first substrate 2210 may be formed under the first substrate 2210, and a first input/output pad 2205 may be formed on the lower insulating layer 2201. The first input/output pad 2205 may be connected to at least one of the plurality of circuit elements 2220*a*, 2220*b* and 2220*c* disposed in the peripheral circuit area PERI, through a first input/output contact plug 2203, and the lower insulating layer 2201) May be separated from the first substrate 2210. In addition, a side insulating film may be disposed between the first input/output contact plug 2203 and the first substrate 2210 to electrically separate the first input/output contact plug 2203 from the first substrate 2210.

Referring to FIG. 24, an upper insulating layer 2301 covering an upper surface of the second substrate 2310 may be disposed on the second substrate 2310, and a second input/output pad 2305 may be formed on the upper insulating layer 2301. The second input/output pad 2305 may be connected to at least one of the plurality of circuit elements 2220*a*, 2220*b*, and 2220*c* disposed in the peripheral circuit area PERI, through a second input/output contact plug 2303.

According to example embodiments, the second substrate 2310 and the common source line 2320 may not be disposed in an area in which the second input/output contact plug 2303 is disposed. Also, the second input/output pad 2305 may not overlap with the word lines 2380 in the third direction (Z-axis direction). Referring to FIG. 24, the second input/output contact plug 2303 may be separated from the second substrate 2310 in a direction parallel to the upper surface of the second substrate 2310, and may penetrate through an interlayer insulating layer 2315 of the cell area CELL to be connected to the second input/output pad 2305.

According to example embodiments, the first input/output pad 2205 and the second input/output pad 2305 may be selectively formed. For example, the memory device 2000 may include only the first input/output pad 2205 disposed on the first substrate 2201 or only the second input/output pad 2305 disposed on the second substrate 2301. Alternatively, the memory device 2000 may also include both the first input/output pad 2205 and the second input/output pad 2305.

In each of the external pad bonding area PA and the bit line bonding area BLBA included in each of the cell area CELL and the peripheral circuit area PERI, a metal pattern of an uppermost metal layer may exist as a dummy pattern, or the uppermost metal layer may be empty.

In the external pad bonding area PA of the memory device 2000, a lower metal pattern 2273*a* having the same shape as the upper metal pattern 2372*a* of the cell region CELL may be formed on the uppermost metal layer of the peripheral circuit region PERI, to correspond to the upper metal pattern 2372*a* formed on the uppermost metal layer of the cell region CELL. The lower metal pattern 2273*a* formed on the uppermost metal layer of the peripheral circuit area PERI may not be connected to a separate contact in the peripheral circuit area PERI. Similarly, in the external pad bonding area PA, an upper metal pattern having the same shape as the lower metal pattern of the peripheral circuit area PERI may be formed on the upper metal layer of the cell area CELL, to correspond to the lower metal pattern formed on the uppermost metal layer of the peripheral circuit area PERI.

Lower bonding metals 2271*b* and 2272*b* may be formed on the second metal layer 2240*b* of the word line bonding area WLBA. In the word line bonding area WLBA, the lower bonding metals 2271*b* and 2272*b* of the peripheral circuit area PERI may be electrically connected to the upper bonding metals 2231*b* and 2372*b* of the cell area CELL through a bonding method manner.

In addition, in the bit line bonding area BLBA, an upper metal pattern 2392 having the same shape as the lower metal pattern 2252 of the peripheral circuit area PERI may be formed on the uppermost metal layer of the cell area CELL, to correspond to the lower metal pattern 2252 formed on the uppermost metal layer of the peripheral circuit area PERI. A contact may not be formed on the upper metal pattern 2392 formed on the uppermost metal layer of the cell area CELL.

Figure 25:
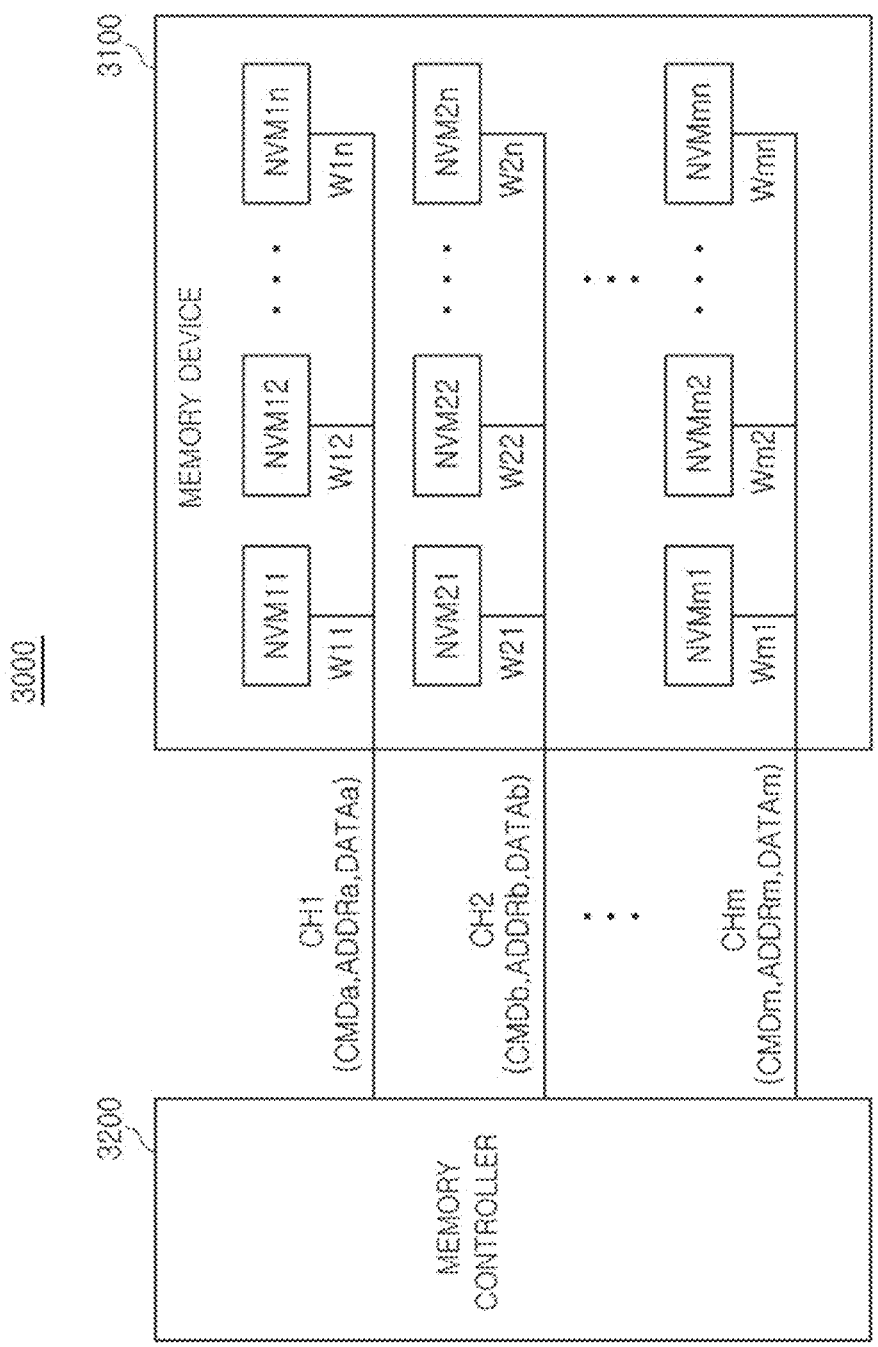
FIG. 25 is a block diagram illustrating a memory system according to an example embodiment.

FIG. 25 is a block diagram illustrating a memory system according to an example embodiment.

Referring to FIG. 25, a memory system 3000 may include a memory device 3100 and a memory controller 3200. The memory system 3000 may support a plurality of channels CH1 to CHm, and the memory device 3100 and the memory controller 3200 may be connected through the plurality of channels CH1 to CHm. For example, the memory system 3000 may be implemented as a storage device such as a solid state drive (SSD).

The memory device 3100 may include a plurality of memory devices NVM11 to NVMmn. For example, the memory devices NVM11-NVMmn may have nonvolatile characteristics. The memory devices NVM11 to NVMmn may be respectively connected to one of the plurality of channels CH1 to CHm through a corresponding way. For example, some of the memory devices NVM11 to NVM1n may be connected to the first channel CH1 through the ways W11 to W1n, and some of the memory devices NVM21 to NVM2n may be connected to the second channel CH2 through the ways W21-W2n. In an example embodiment, the memory devices NVM11 to NVMmn may be implemented respectively in an arbitrary memory unit capable of operating according to an individual command from the memory controller 3200. For example, each of the memory devices NVM11 to NVMmn may be implemented as a chip or die. However, example embodiments are not limited thereto.

The memory controller 3200 may transmit and receive signals with the memory device 3100 through the plurality of channels CH1 to CHm. For example, the memory controller 3200 may transmit commands CMDa to CMDm, addresses ADDRa to ADDRm, and data DATAa to DATAm to the memory device 3100 through the channels CH1 to CHm, or may receive the data DATAa to DATAm from the memory device 3100.

The memory controller 3200 may select one of memory devices connected to a corresponding channel through each channel, and may transmit/receive signals to and from the selected memory device. For example, the memory controller 3200 may select one memory device NVM11 from among the memory devices NVM11 to NVM1n connected to the first channel CH1. The memory controller 200 may transmit a command CMDa, an address ADDRa, and data DATAa to the selected memory device NVM11 through the first channel CH1, or may receive the data DATAa from the selected memory device NVM11.

The memory controller 3200 may transmit and receive signals with the memory device 3100 in parallel through different channels. For example, while the memory controller 3200 may transmit the command CMDa to the memory device 3100 through the first channel CH1, the memory controller 3200 may transmit the command CMDb to the memory device 3100 through the second channel CH2. For example, the memory controller 3200 may receive data DATAb from the memory device 3100 through the second channel CH2 while receiving data DATAa from the memory device 3100 through the first channel CH1.

The memory controller 3200 may control the overall operation of the memory device 3100. The memory controller 3200 may control each of the memory devices NVM11 to NVMmn connected to the channels CH1 to CHm by transmitting signals to the channels CH1 to CHm. For example, the memory controller 3200 may control a selected one of the memory devices NVM11 to NVM1n by transmitting the command CMDa and the address ADDRa to the first channel CH1.

Each of the memory devices NVM11 to NVMmn may operate under the control of the memory controller 3200. For example, the memory device NVM11 may program the data DATAa according to the command CMDa, the address ADDRa, and the data DATAa provided through the first channel CH1. For example, the memory device NVM21 may read the data DATAb according to the command CMDb and the address ADDRb provided through the second channel CH2 and may transmit the read data DATAb to the memory controller 3200.

Although FIG. 25 illustrates that the memory device 3100 communicates with the memory controller 3200 through m channels and the memory device 3100 includes n nonvolatile memory devices corresponding to channels respectively, the number of channels and the number of nonvolatile memory devices connected to one channel may be variously changed.

In the example embodiment illustrated in FIG. 25, at least one of the memory devices NVM11-NVMmn may be implemented as a memory device according to the example embodiments described above. For example, the memory device NVM11 may receive a command CMD1 for executing an erase operation from the memory controller 3200 through the first channel CH1 and may execute the erase operation in response thereto. In an example embodiment, the memory device NVM11 may execute an erase operation in a block unit, and may reduce respective voltages of the first word line and the second word line included in the block at different points in time while the erase operation is being executed. Accordingly, a problem in which the efficiency of the erase operation is deteriorated because the voltage of the channel layer increases greater than the erase voltage input through the bit line and/or the common source line may be prevented, and the difference in threshold voltage distribution between memory cells connected to different word lines may be reduced.

As set forth above, according to example embodiments, the voltage of word lines may be reduced from a first bias voltage to a second bias voltage in an erase operation, and timings of decreasing the voltage of at least some of the word lines from the first bias voltage to the second bias voltage may be applied differently. The coupling effect between the word lines and the channel layer may be reduced by reducing the voltage of the word lines during the erase operation, thereby performing a stable erase operation. In addition, performance of the memory device may be improved by significantly reducing a difference in threshold voltage distribution between memory cells after the erase operation.

While example embodiments have been illustrated and described above, it will be apparent to those skilled in the art that modifications and variations could be made without departing from the scope of the appended claims.

What is claimed is:

1. A memory device comprising:
   a cell area in which a plurality of memory blocks, each including a plurality of memory cells, are disposed; and
   a peripheral circuit area including peripheral circuits that control the plurality of memory blocks and that are configured to execute an erase operation for each of the plurality of memory blocks as a unit,
   wherein each of the plurality of memory blocks includes a plurality of word lines that are stacked on a substrate, a plurality of channel structures that extend in a first direction perpendicular to an upper surface of the substrate and that penetrate through the plurality of word lines, and a source region that is disposed on the substrate and connected to the plurality of channel structures, and during the erase operation in which an erase voltage is provided to the source region of a target memory block among the plurality of memory blocks, the peripheral circuits are configured to reduce a voltage of a first word line from a first bias voltage to a second bias voltage at a first time, and to reduce a voltage of a second word line, different from the first word line, from a third bias voltage to a fourth bias voltage at a second time different from the first time.

2. The memory device of claim 1, wherein the second word line is disposed between the first word line and the substrate in the first direction, and the second time is later than the first time.

3. The memory device of claim 1, wherein the first word line includes a plurality of first word lines, and the second word line includes a plurality of second word lines.

4. The memory device of claim 1, wherein the peripheral circuits include a plurality of pass elements connected to the plurality of word lines, and are configured to sequentially input a first turn-on voltage and a second turn-on voltage less than the first turn-on voltage to a gate terminal of each of the plurality of pass elements, during the erase operation.

5. The memory device of claim 4, wherein the first turn-on voltage is input to the gate terminal of each of the plurality of pass elements during a transition period in which a voltage of the source region increases to the erase voltage, and the second turn-on voltage is input to the gate terminal of each of the plurality of pass elements during a hold period in which the voltage of the source region is maintained at the erase voltage.

6. The memory device of claim 1, wherein the first bias voltage is different than the third bias voltage.

7. The memory device of claim 1, wherein the second bias voltage is different than the fourth bias voltage.

8. The memory device of claim 1, wherein an erase time in which the erase operation is executed includes a transition period in which a voltage of the source region increases to the erase voltage, and a hold period in which the voltage of the source region is maintained at the erase voltage, and the first time and the second time are in the hold period.

9. The memory device of claim 8, wherein each of the plurality of memory blocks includes a plurality of string selection lines disposed above the plurality of word lines in the first direction and a ground selection line disposed below the plurality of word lines in the first direction, and the peripheral circuits are configured to turn off the plurality of string selection lines until a first turn-on point that is in the transition period and to input a first suppression voltage to the plurality of string selection lines after the first turn-on point, and are configured to turn off the ground selection line until a second turn-on point that is in the transition period and to input a second suppression voltage to the ground selection line after the second turn-on point.

10. The memory device of claim 9, wherein the first suppression voltage and the second suppression voltage are greater than the first bias voltage and the third bias voltage.

11. The memory device of claim 1, wherein the peripheral circuits are configured to sequentially execute a first erase operation, a verification operation, and a second erase operation, wherein the first erase operation is the erase operation, and the verification operation includes an operation of reading data from the plurality of memory cells included in the target memory block after the first erase operation.

12. The memory device of claim 11, wherein in the second erase operation, the peripheral circuits are configured to reduce the voltage of the first word line from the first bias voltage to the second bias voltage at a third time, and to input a suppression voltage greater than the first bias voltage to the second word line.

13. The memory device of claim 11, wherein in the second erase operation, the peripheral circuits are configured to reduce the voltage of the first word line from a fifth bias voltage to a sixth bias voltage at a third time, and to reduce the voltage of the second word line from a seventh bias voltage to an eighth bias voltage at a fourth time different from the third time.

14. A memory device comprising:
a plurality of word lines stacked on a substrate;
a plurality of channel structures that extend in a first direction perpendicular to an upper surface of the substrate and that penetrate through the plurality of word lines;
a source region disposed on the substrate and connected to the plurality of channel structures;
a plurality of separation layers that divide the plurality of word lines into a plurality of memory blocks; and
a peripheral circuit configured to input an erase voltage to the source region in an erase operation executed for each of the plurality of memory blocks as a unit,
wherein the plurality of word lines include a first word line group and a second word line group each including two or more word lines, the second word line group being disposed between the first word line group and the substrate in the first direction, and
the peripheral circuit is configured to input a same voltage to the first word line group and the second word line group while a voltage of the source region increases to the erase voltage, and is configured to reduce a voltage input to the first word line group earlier than a voltage input to the second word line group is reduced, while the voltage of the source region is maintained at the erase voltage.

15. The memory device of claim 14, comprising a first erase control line disposed below the plurality of word lines in the first direction and a second erase control line disposed above the plurality of word lines in the first direction, wherein each of the plurality of channel structures includes a channel layer, wherein the channel layer includes a first channel layer adjacent to the plurality of word lines, and a second channel layer adjacent to the first erase control line and the second erase control line and having a conductivity different from a conductivity of the first channel layer.

16. The memory device of claim 15, wherein the second channel layer is doped with an N-type impurity.

17. The memory device of claim 14, wherein each of the plurality of channel structures includes a channel layer, the channel layer including a first region penetrating through the first word line group and a second region penetrating through the second word line group, wherein a width of the channel layer in the first region is greater than a width of the channel layer in the second region.

18. A memory device comprising:
- a cell area in which a plurality of memory blocks are disposed, each of the plurality of memory blocks including a plurality of word lines that are stacked on a substrate, a plurality of channel layers that extend in a first direction perpendicular to an upper surface of the substrate and that penetrate through the plurality of word lines, and a source region that is disposed on the substrate and connected to the plurality of channel layers; and
- a peripheral circuit area including peripheral circuits that control the cell area and that are configured to execute an erase operation for each of the plurality of memory blocks as a unit,
- wherein an erase time at which an erase voltage is input to the source region includes a transition period in which a voltage of the source region increases to the erase voltage and a hold period in which the voltage of the source region is maintained at the erase voltage, and
- the peripheral circuit area is configured to set a voltage difference between the plurality of word lines and the plurality of channel layers to a first level during a first time in the hold period, to set a voltage difference between a portion of the plurality of word lines and the plurality of channel layers to a second level higher than the first level during a second time after the first time, and to set the voltage difference between the plurality of word lines and the plurality of channel layers to the second level during a third time after the second time.

19. The memory device of claim 18, wherein the substrate included in the cell area is a first substrate, and the peripheral circuit area includes a second substrate on which the peripheral circuits are disposed and which is different from the first substrate, and
- the cell area and the peripheral circuit area are stacked in a direction perpendicular to an upper surface of the first substrate.

20. The memory device of claim 19, wherein the cell area includes first metal pads, and the peripheral circuit area includes second metal pads,
- wherein the cell area and the peripheral circuit area are connected to each other in the direction perpendicular to the upper surface of the first substrate by the first metal pads and the second metal pads.

* * * * *